(12) United States Patent
Ohba et al.

(10) Patent No.: US 7,034,348 B2
(45) Date of Patent: Apr. 25, 2006

(54) MAGNETORESISTIVE EFFECT ELEMENT AND MAGNETIC MEMORY DEVICE

(75) Inventors: Kazuhiro Ohba, Miyagi (JP); Hiroshi Kano, Kanagawa (JP); Masanori Hosomi, Miyagi (JP); Kazuhiro Bessho, Kanagawa (JP); Tetsuya Yamamoto, Kanagawa (JP); Tetsuya Mizuguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/491,324

(22) PCT Filed: Aug. 1, 2003

(86) PCT No.: PCT/JP03/09825

§ 371 (c)(1),
(2), (4) Date: Mar. 31, 2004

(87) PCT Pub. No.: WO2004/013919

PCT Pub. Date: Feb. 12, 2004

(65) Prior Publication Data

US 2004/0262654 A1    Dec. 30, 2004

(30) Foreign Application Priority Data

Aug. 2, 2002    (JP) .............................. 2002-226520

(51) Int. Cl.
*H01L 29/76* (2006.01)
(52) U.S. Cl. ...................... 257/295; 257/296; 257/298; 257/303; 257/306; 257/324; 438/3; 438/240
(58) Field of Classification Search ................. 257/55, 257/63, 68, 71, 295–314, 324–326; 438/3, 438/240
See application file for complete search history.

(56) References Cited

U.S. PATENT DOCUMENTS

| 4,236,946 | A | * | 12/1980 | Aboaf et al. | ................. 148/108 |
| 4,306,908 | A | * | 12/1981 | Takayama et al. | .......... 148/403 |
| 4,553,136 | A | * | 11/1985 | Anderson, III et al. | .. 340/572.2 |
| 4,748,089 | A | * | 5/1988 | Kumasaka et al. | ......... 428/635 |
| 4,837,094 | A | * | 6/1989 | Kudo | ..................... 428/694 T |
| RE33,022 | E | * | 8/1989 | Takayama et al. | .......... 148/304 |
| 5,239,504 | A | * | 8/1993 | Brady et al. | ................. 365/157 |
| 6,767,655 | B1 | * | 7/2004 | Hiramoto et al. | ........... 428/692 |
| 2002/0177013 | A1 | | 11/2002 | Hiramoto et al. | |

FOREIGN PATENT DOCUMENTS

CN            1343016          4/2002

(Continued)

*Primary Examiner*—Andy Huynh
(74) *Attorney, Agent, or Firm*—Sonnenschein, Nath & Rosenthal LLP

(57) ABSTRACT

A magnetoresistive effect element may be given satisfactory magnetic characteristics because a deterioration of a magnetoresistive changing rate by annealing can be suppressed and a magnetic memory device includes this magnetoresistive effect element to provide excellent write characteristics. A magnetoresistive effect element has a pair of ferromagnetic layers (magnetization fixed layer 5 and magnetization free layer 7) opposed to each other through an intermediate layer 6 to cause an electric current to flow in the direction perpendicular to the layer surface to obtain a magnetoresistive change. A magnetic memory device comprises the magnetoresistive effect element 1 in which at least one of the pair of ferromagnetic layers 5, 7 contains an amorphous ferromagnetic material whose crystallization temperature is higher than 623 K and bit lines and word lines sandwiching this magnetoresistive effect element and the magnetoresistive effect element in the thickness direction.

5 Claims, 6 Drawing Sheets

FOREIGN PATENT DOCUMENTS

| | | |
|---|---|---|
| EP | 1202357 | 5/2002 |
| JP | 08-203035 | 8/1996 |
| JP | 11-353619 | 12/1999 |
| JP | 2002-190631 | 5/2002 |
| JP | 2002-204004 | 7/2002 |
| JP | 2002-208120 | 7/2002 |
| JP | 2003-158312 | 5/2003 |
| KR | 2002-0020867 | 3/2002 |

* cited by examiner

MAGNETORESISTIVE EFFECT ELEMENT AND MAGNETIC MEMORY DEVICE

BACKGROUND OF THE INVENTION

This application is a 371 of PCT/JP03/09825 Aug. 1, 2003

The present invention relates to a magnetoresistive effect element having an arrangement to obtain a magnetoresistive change by causing an electric current to flow in the direction perpendicular to the layer surface and a magnetic memory device including the magnetoresistive effect element.

Information communication devices, in particular, personal small devices such as personal digital assistants are making great spread, elements such as memories and logics comprising information communication devices are requested to have higher performance such as higher integration degree, higher operation speed and lower power consumption. In particular, technologies for making nonvolatile memories become higher in density and larger in storage capacity are progressively increasing their importance as technologies for replacements of hard disk and optical disc that cannot be essentially miniaturized because they have movable portions.

As nonvolatile memories, there may be enumerated flash memories using semiconductors and an FRAM (Ferro electric Random Access Memory) using ferroelectric material and the like.

However, the flash memory encounters with a drawback that its write speed is as slow as the microsecond order. On the other hand, it has been pointed out that the FRAM has a problem in which it cannot be rewritten so many times.

A magnetic memory device called an MRAM (Magnetic Random Access Memory) described in "Wang et al., IEEE Trans. Magn. 33 (1977), 4498", receives a remarkable attention as a nonvolatile memory which can overcome these drawbacks. Since this MRAM is simple in structure, it can easily be integrated at a higher integration degree. Moreover, since it is able to record information based upon the rotation of magnetic moment, it can be rewritten so many times. It is also expected that the access time of this magnetic random access memory will be very high, and it was already confirmed that it can be operated at the access time of nanosecond order.

A magnetoresistive effect element for use with this MRAM, in particular, a tunnel magnetoresisitve effect (Tunnel Magnetoresistance: TMR) element is fundamentally composed of a lamination layer structure of a ferromagnetic tunnel junction of ferromagnetic layer/tunnel barrier layer/ ferromagnetic layer. This element generates magnetoresistive effect in response to a relative angle between the magnetization directions of the two magnetic layers when an external magnetic field is applied to the ferromagnetic layers under the condition in which a constant current is flowing through the ferromagnetic layers. When the magnetization directions of the two magnetic layers are anti-parallel to each other, a resistance value is maximized. When they are parallel to each other, a resistance value is minimized. Functions of memory element can be demonstrated by creating the anti-parallel state and the parallel state with application of the external magnetic field when the magnetization direction of one ferromagnetic layer is inverted.

In particular, in a spin-valve type TMR element, when one ferromagnetic layer is antiferromagnetically coupled to the adjacent antiferromagnetic layer, it is set to the magnetization fixed layer of which magnetization direction is constantly made constant. The other ferromagnetic layer is set to the magnetization free layer of which magnetization direction is easily inverted with application of an external magnetic field and the like. Then, this magnetization free layer becomes an information recording layer in a magnetic memory.

In the spin-valve type TMR element, its resistance changing ratio is expressed by the following equation (A) where P1, P2 represent spin polarizabilities of the respective ferromagnetic layers.

$$2P1P2/(1-P1P2) \quad (A)$$

As described above, the resistance changing ratio increases as the respective spin polarizabilities increase. With respect to a relationship between materials for use with ferromagnetic layers and this resistance changing ratio, ferromagnetic chemical elements of Fe group such as Fe, Co, Ni and alloys of three kinds thereof have already been reported so far.

Information is read out from the TMR element of the MRAM based upon a difference current with application of a constant bias voltage or a difference voltage with application of a constant bias current in the state of "1", for example, obtained when directions of magnetic moments of one ferromagnetic layer and the other ferromagnetic layer sandwiching the tunnel barrier layer are anti-parallel to each other and a resistance value is high and in the state of "0" obtained when the directions of the magnetic moments are parallel to each other.

Accordingly, a higher TMR ratio (magnetoresistive changing ratio) is advantageous, and hence a high-speed memory having a high integration degree and a low error rate can be realized.

In addition, the TMR element having the ferromagnetic layer/tunnel barrier layer/ferromagnetic layer has a bias voltage dependence of TMR ratio, and it is known that the TMR ratio decreases as the bias voltage increases. Since it is known that, in most cases, a read signal takes a maximum value at a voltage (Vh) in which a TMR ratio decreases to the half depending on the bias voltage dependence when information is read out the magnetic memory by a difference current or a difference voltage, a small bias voltage dependence is effective for decreasing read errors.

The MRAM includes switching elements such as transistors to select a TMR element, in addition to the above-mentioned TMR element, and has a semiconductor circuit including the switching element.

When such semiconductor circuit and the TMR element coexist within the same chip, since a semiconductor circuit manufacturing process requires a process for heating the chip at temperature in excess of 350° C., the TMR element needs similar temperature durability.

However, it is known that a TMR element having a ferromagnetic layer made of alloy of Fe-group chemical element such as Fe, Co and Ni is considerably deteriorated in magnetoresistive changing ratio at temperature higher than about 300° C., and therefore it has a problem from a heat-resisting property standpoint. This magnetoresistive changing ratio may be deteriorated by undesired impurities entered into the ferromagnetic layer or the tunnel barrier layer after components of layers comprising the TMR element have been mutually diffused by heat.

Therefore, when the magnetization free layer is made of amorphous alloy in which B, Si, C, P, Al, Ge, Ti, Nb, Ta, Zr, Mo are added to the alloy of the Fe-group chemical element such as Fe, Co and Ni, the magnetoresistive changing ratio can be improved and the magnetization direction can be inverted with stability so that read characteristics in the MRAM can be improved.

However, when such amorphous alloy is heated at temperature higher than its crystallization temperature, magnetic characteristics, those requested for the TMR element for use with MRAM, such as magnetoresistive changing ratio are deteriorated.

As described above, in order to realize the MRAM that can make the excellent read characteristics and high affinity of the semiconductor circuit manufacturing process become compatible with each other, the magnetic characteristics (high magnetoresistive changing ratio, etc.) of the TMR element should be guaranteed after the magnetic element has experienced relatively high temperature. For this reason, it has been requested so far to improve heat-resisting property of the TMR element.

In order to solve the above-mentioned problems, it is an object of the present invention to provide a magnetoresistive effect element having satisfactory magnetic characteristics in which deterioration of a magnetoresistive changing ratio due to annealing can be suppressed and a magnetic memory device including this magnetoresistive effect element and which has excellent write characteristics.

SUMMARY OF THE INVENTION

All references herein and in the claims to "623 K" shall mean 623 degrees Kelvin.

A magnetoresistive effect element according to the present invention has a pair of ferromagnetic layers opposed to each other through an intermediate layer to obtain a magnetoresistive change by causing an electric current to flow in the direction perpendicular to the layer surface, at least one of the ferromagnetic layers containing an amorphous ferromagnetic material of which crystallization temperature is higher than 623 K.

A magnetic memory device according to the present invention comprises a magnetoresistive effect element having a pair of ferromagnetic layers opposed to each other through an intermediate layer to obtain a magnetoresistive change by causing an electric current to flow in the direction perpendicular to the layer surface and a word line and a bit line sandwiching this magnetoresistive effect element in the thickness direction, one of the pair of ferromagnetic layers containing an amorphous ferromagnetic material of which crystallization temperature is higher than 623 K.

According to the above-mentioned arrangement of the magnetoresistive effect element of the present invention, since at least one of the pair of ferromagnetic layers contains the amorphous ferromagnetic material of which crystallization temperature is higher than 623 K, heat-resisting temperature can be improved, and hence heat-resisting property of the magnetoresistive effect element can be improved.

According to the above-mentioned arrangement of the magnetic memory device of the present invention, since the magnetic memory device includes the magnetoresistive effect element and the word line and the bit line sandwiching the magnetoresistive effect element in the thickness direction and the magnetoresistive effect element is the magnetoresistive effect element of the present invention, heat-resisting property can be improved, and hence a magnetoresistive changing ratio can be suppressed from being lowered due to annealing and excellent read characteristics can be realized.

DETAILED DESCRIPTION OF THE PRESENTLY PREFERRED EMBODIMENTS

Figure 1:
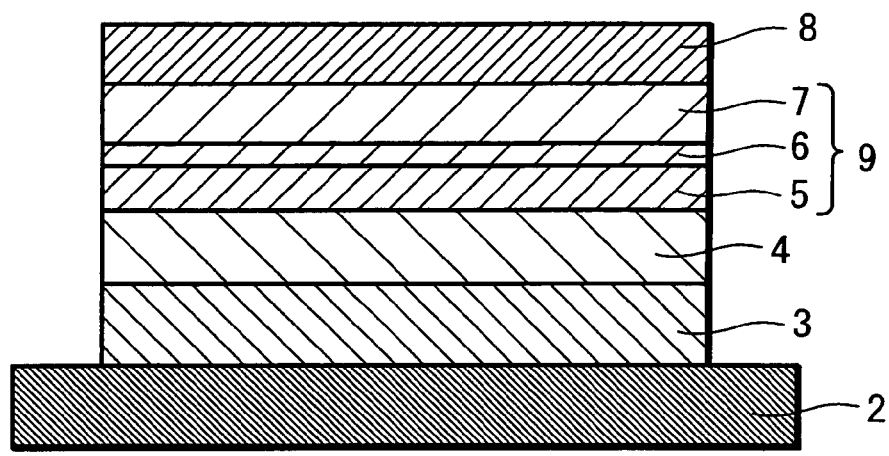
FIG. 1 is a schematic diagram showing a TMR element according to an embodiment of the present invention.

The present invention relates to a magnetoresistive effect element having a pair of ferromagnetic layers opposed to each other through an intermediate layer to obtain a magnetoresistive change by causing an electric current to flow in the direction perpendicular to the layer surface, the magnetoresistive effect element having the pair of ferromagnetic layers in which at least one of them contains an amorphous ferromagnetic material of which crystallization temperature is higher than 623 K According to the present invention, the above-described magnetoresistive effect element is a spin-valve type magnetoresistive effect element in which one of the pair of ferromagnetic layers is a magnetization fixed layer and the other is magnetization free layer.

According to the present invention, the magnetoresistive effect element is a tunnel magnetoresistive effect element using a tunnel barrier layer made of an insulating material or a semiconductor as an intermediate layer.

According to the present invention, the above-described magnetoresistive effect element has a synthetic ferrimagnet structure.

According to the present invention, in the above-described magnetoresistive effect element, the amorphous ferromagnetic material is a ferromagnetic material mainly composed of any one of or more than two kinds of Fe, Co, Ni and which contains more than any one kind of B, Si, C, P, Al, Ge, Ti, Nb, Ta, Zr, Mo as added elements.

According to the present invention, there is provided a magnetic memory device comprising a magnetoresistive effect element having a pair of ferromagnetic layers opposed to each other through an intermediate layer to obtain a magnetoresistive change by causing an electric current to flow in the direction perpendicular to the layer surface and word lines and bit lines sandwiching the magnetoresistive effect elements in the thickness direction, at least one of the pair of ferromagnetic layers containing an amorphous ferromagnetic material of which crystallization temperature is higher than 263 K.

Also, according to the present invention, in the above-described magnetic memory device, the magnetoresistive effect element is a spin-valve type magnetoresistive effect element in which one of the pair of ferromagnetic layers is a magnetization fixed layer, the other being a magnetization free layer.

Also, according to the present invention, in the magnetic memory device, the magnetoresistive effect element is a tunnel magnetoresistive effect element using a tunnel barrier layer made of an insulating material or a semiconductor as the intermediate layer.

Also, according to the present invention, in the above-described magnetic memory device, the magnetoresistive effect element has a synthetic ferrimagnet structure.

Additionally, according to the present invention, the amorphous ferromagnetic material is a ferromagnetic material mainly composed of any one of or more than two kinds of Fe, Co, Ni and which contains more than any one kind of B, Si, C, P, Al, Ge, Ti, Nb, Ta, Zr, Mo as added elements for making a ferromagnetic layer become an amorphous ferromagnetic layer.

FIG. 1 is a schematic diagram showing an arrangement of a magnetoresistive effect element according to an embodiment of the present invention. The embodiment shown in FIG. 1 shows the case in which the present invention is applied to a tunnel magnetoresistive effect element (hereinafter referred to as a "TMR element").

This TMR element 1 has a substrate 2 made of a suitable material such as silicon on which there are laminated an underlayer 3, an antiferromagnetic layer 4, a magnetization free layer 5, which is a ferromagnetic layer, a tunnel barrier layer 6, a magnetization free layer 7, which is a ferromagnetic layer and a top-coat layer 8, in that order.

More specifically, this tunnel magnetoresistive effect element constructs a so-called spin-valve type TMR element in which one of the ferromagnetic layers is the magnetization fixed layer 5, the other being the magnetization free layer 7. The magnetization fixed layer 5 and the magnetization free layer 7 that are the pair of ferromagnetic layers sandwich the tunnel barrier layer 6 to form a ferromagnetic tunnel junction 9.

When this TMR element 1 is applied to a suitable magnetic device such as a magnetic memory device, the magnetization free layer 7 becomes an information recording layer to record therein information.

The antiferromagnetic layer 4 is coupled antiferromagnetically to the magnetization fixed layer 5, which is one of the ferromagnetic layers, to prevent the magnetization direction of the magnetization fixed layer 5 from being inverted with application of an electric current field used to write information so that the magnetization direction of the magnetization fixed layer 5 can constantly be made constant. More specifically, in the TMR element 1 shown in FIG. 1, the magnetization direction of the magnetization free layer 7, which is the other ferromagnetic layer, is inverted by a suitable means such as an external magnetic field. The magnetization free layer 7 becomes a layer to record therein information when it is applied to a suitable means such as a magnetic memory device, and is therefore referred to as an "information recording layer".

As materials comprising the antiferromagnetic layer 4, there can be used Mn alloy containing Fe, Ni, Pt, Ir, Rh and the like, Co oxide, Ni oxide and so on.

In the spin-valve type TMR element 1 shown in FIG. 1, the magnetization direction of the magnetization fixed layer 5 is made constant when it is coupled to the antiferromagnetic layer 4 antiferromagnetically. Therefore, the magnetization direction of the magnetization fixed layer 5 is not inverted with application of an electric current field used to write information.

The tunnel barrier layer 6 is the layer used to magnetically separate the magnetization fixed layer 5 and the magnetization free layer 7 from each other and which is used to allow a tunnel electric current to flow therethrough.

Oxides such as Al, Mg, Si, Li, Ca, nitride and halogenide can be used as materials comprising the tunnel barrier layer 6.

The tunnel barrier layer 6 can be obtained oxidizing or nitriding a metal film that has been deposited by a suitable method such as a sputtering method or a vapor-evaporation method.

Additionally, this tunnel barrier layer can be obtained by a CVD method using organic metals, oxygen, ozone, nitrogen, halogen, halogenide gas and so on.

In accordance with this embodiment, at least one of the magnetization fixed layer 5 and the magnetization free layer 7, which are the pair of ferromagnetic layers comprising, in particular, the ferromagnetic funnel junction 9, contains an amorphous ferromagnetic material of which crystallization temperature is higher than 623 K.

Conventional TMR elements having ferromagnetic layers (ferromagnetic layers in this case are amorphous ferromagnetic layers) composed of only ferromagnetic transition metal elements or TMR elements using as ferromagnetic layers amorphous ferromagnetic layers with crystallization temperature lower than 623 K encounter with defects in which a TMR ratio is deteriorated by annealing required in a semiconductor circuit manufacturing process and the like or a rectangle ratio of an R—H loop (resistance-magnetic field curve) is deteriorated.

On the other hand, the above-mentioned defects can be improved by the ferromagnetic layer made of an amorphous ferromagnetic material whose crystallization temperature is higher than 623 k.

Although a cause for achieving such effect is not clear, since a comparison of the crystal ferromagnetic layer and the amorphous ferromagnetic layer reveals that a metalloid element such as B and Si added to make the crystal ferromagnetic layer become an amorphous ferromagnetic layer has a covalent bonding with Fe-group ferromagnetic elements such as Co, Fe, Ni which are main components microscopically and a structure of a short period range has a quality close to that of an intermetallic compound such as $Co_3B$, $Co_2B$, $Co_2Si$, bond energy is high and bond between the ferromagnetic metal element and the metalloid element is relatively strong, and hence these undesired elements can be suppressed from being diffused into the tunnel barrier layer.

Also, in the amorphous magnetic material having crystallization temperature higher than 623 K, its amorphous structure may be stable at higher temperature, and a disordered structure peculiar to the amorphous structure may be maintained at high temperature in the long period range. In addition, since the amorphous magnetic material has bond having a covalent bond-like element in the short period range, these undesired elements can be suppressed from being diffused into the tunnel barrier layer 6 at higher temperature.

As compared with the magnetic element in which the magnetization free layer is made of the crystal ferromagnetic material, the magnetic element in which the magnetization free layer is made of the amorphous ferromagnetic material behaves stably when the magnetization direction thereof is inverted and exhibits excellent magnetic characteristics.

Thus, the magnetic element exhibits excellent switching characteristics when the TMR element is applied to a magnetic memory device such as an MRAM.

However, when the amorphous ferromagnetic material for use with the magnetization free layer is heated up to temperature higher than its crystallization temperature, the magnetic characteristic of the magnetic element is deteriorated and cannot exhibit excellent magnetic characteristic. The semiconductor circuit process needs processes which require annealing with temperature higher than 350° C.

For this reason, the magnetization free layer is made of an amorphous ferromagnetic material having crystallization temperature higher than at least 623 K (350° C.), thereby decreasing damages exerted upon the magnetic characteristics of the magnetization free layer due to heat generated from the semiconductor circuit process. As a result, affinity of the TMR element with the semiconductor circuit process can be improved.

Alloy-based amorphous ferromagnetic materials containing any one kind or more than two kinds of B, Si, C, P, Al, Ge, Ti, Nb, Ta, Zr, Mo relative to Fe, Ni, Co which exhibit ferromagnetic properties by simple substance may be available as amorphous ferromagnetic materials having crystallization temperature higher than 623 K. Since it is generally considered that crystallization temperatures of amorphous alloys of desired combinations and amorphous alloys containing other elements, e.g., rare earth elements, Sc, Y, La, Ce, Pr, Nd, Pm, Sm, Eu, Gd, Tb, Dy, Ho, Er, Tm, Yb, Lu and amorphous alloys containing V, Nb, Ta, Cr, Mo, W which are high-melting point metals as simple substance tend to rise, they are suitable for being added to the amorphous ferromagnetic material so long as addition of such amorphous alloy does not hinder amorphous formation ability.

When a material-base composed of Co, Fe, Si and B, for example, is selected as the amorphous ferromagnetic material, dependence exists between crystallization temperature of the amorphous ferromagnetic material and its composition ratio (ratio between Fe-group element and additive element). When B, Si are added to Fe—Co alloy, for example, if B is added to the above alloy alone, then the amorphous structure is added to the alloy wherein B added amount falls within a range of from 10 to 30 atomic %.

However, the crystallization temperature increases as the concentration of B increases. For example, when B of 15 atomic % is added to Co, crystallization temperature reaches about 650 K, when 20 atomic % is added, crystallization temperature reaches about 660 K, and when 27 atomic % is added, crystallization temperature reaches about 700 K.

When B and Si are both added to cobalt, the crystallization temperature rises much more. For example, when B of 20 atomic % and Si of 10 atomic % are added to cobalt, the crystallization temperature rises up to about 800 K.

As described above, an alloy composition of Co, Fe, Si, B has an optimum range. Therefore, excepting inevitable impurity elements, amorphous ferromagnetic materials which at least one of the magnetic layers contains are composed of a composition formula $Fe_wCo_xSi_yB_z$ (in this composition formula, w, x, y and z express atomic % and w+x+y+z=100), and therefore, $5 \leq w \leq 45$, $35 \leq x \leq 85$, $0 \leq y \leq 20$ and $10 \leq z \leq 30$ should preferably be satisfied.

This optimum range of alloy composition will be described in detail below.

In the material base composed of Co, Fe, Si and B, the preferable added amount of Si and the preferable added amount of B are as follows.

When the added amount of B is less than 10 atomic %, since the amorphous structure is difficult to be formed and the crystallization temperature reaches about 600 K, thermal stability of amorphous substance phase is low. With respect to the magnetic characteristics, a magnetic characteristic of an Fe—Co alloy which becomes a base material reflects considerably and only gentle improvement and effect can be achieved.

Accordingly, the amorphous ferromagnetic material should contain B of greater than 10 atomic %. In particular, in order to obtain crystallization temperature higher than 623 K by addition of only B, the added amount of B should increase in excess of 20 atomic %.

On the other hand, the added amount of B should preferably be made under 30 atomic %. If the added amount of B exceeds 30 atomic %, then the crystallization temperature is lowered and the amorphous substance phase becomes difficult to be formed. More specifically, maximum crystallization temperature exists in a relationship between the added amount of B and the crystallization temperature.

Whereas, when both of B and Si are added to the amorphous ferromagnetic material, if the total amount of the two added amounts is 30 atomic %, then high crystallization temperature can be obtained. For example, when the added amount of B is 15 atomic % and the added amount of Si is 15 atomic %, crystallization temperature as high as about 800 K can be obtained. Since the effect achieved by the addition of Si can be achieved, even when the added amount of B is decreased, similar effects can be achieved by the addition. However, the maximum crystallization temperature exists in the relationship between the added amount of Si and crystallization temperature. For example, when the added amount of B falls within a range of from 10 to 30 atomic %, the maximum crystallization temperature exists in a range in which the added amount of Si falls within a range of from 10 to 15 atomic %. If the added amount exceeds 15 atomic %, then the crystallization temperature begins to decrease in accordance with the increase of the added amount. For example, if the added amount of Si is 20 atomic %, then the crystallization temperature becomes lower than that obtained when the added amount is 15 atomic %. Thus, the crystallization temperature reaches the crystallization temperature ranging of from 750 to 800 K and the magnetic element becomes difficult to have an amorphous structure. Accordingly, it is desired that the added amount of Si should be less than 20 atomic %.

As described above, the added amount of B should preferably be selected in a range of from 10 to 30 atomic %, and the added amount of Si should preferably be selected in a range of from 0 to 20 atomic %. More preferably, the added amount of B should be selected in a range of from 10 to 20 atomic %, and the added amount of Si should be selected in a range of from 5 to 15 atomic %. When the added amount is selected in the above-mentioned range, there can be obtained the amorphous ferromagnetic material having high crystallization temperature ranging of from about 750 K to 830 K, and hence the amorphous ferromagnetic material may have soft magnetic characteristics which are required as those of the magnetization free layer of the TMR element.

Of base alloys, a CoFe alloy of alloys has the following preferable composition ratio between Co and Fe.

In order to realize a high TMR ratio, in the Co—Fe ratio, the alloy should preferably be mainly composed of Co, i.e., should preferably contain Co of which content is greater than 50 atomic %. If the alloy is mainly composed of Fe, i.e., should contain Fe of which content is greater than 50 atomic %, then coercive force increases, and hence the magnetization direction becomes difficult to be inverted. Thus, the resultant amorphous ferromagnetic material becomes unsuitable for use with a magnetization free layer of a miniscule TMR element whose size is in the order of sub-microns.

However, if the amount of Fe is small, then spin polarizability decreases and a sufficient magnetoresistive changing rate cannot be obtained so that the signal output from the TMR element decreases.

Then, in order to obtain a sufficient magnetoresistive changing rate, at least the Fe content should be selected to be greater than 5 atomic %.

As described above, the Fe content in the CoFe alloy should preferably be selected in a range of from 5 atomic % to 50 atomic %.

Also, the alloy which becomes the base of the amorphous ferromagnetic material may contain Ni in addition to Co, Fe.

Even when the alloy contains Ni, while increase of coercive force is being suppressed, a satisfactory TMR ratio can be maintained and a rectangle property of an R—H curve can be improved.

Then, the Ni content also has an optimum range, and hence the Ni content should preferably be selected in a range of from 0 atomic % to 35 atomic %. The reason for this is that, if the Ni content exceeds 35 atomic %, coercive force decreases too much so that it becomes difficult to control operations of the TMR element.

As described above, except inevitable impurity elements, the ferromagnetic material comprising at least one of the ferromagnetic layers 5, 7 is comprised of composition formula $Fe_aCo_bNi_cB_dSi_e$ (in the composition formula, a, b, c, d and e express atomic % and a+b+c+d+e=100), and $5 \leq a \leq 45, 35 \leq b \leq 85, 0 \leq c \leq 35, 10 \leq d \leq 30, 0 \leq e \leq 20$ should preferably be satisfied.

Then, of this composition range, amorphous ferromagnetic material of composition in which crystallization temperature becomes higher than 623 K may be used.

Although the aforementioned effect can be achieved when the amorphous ferromagnetic material with the above-mentioned crystallization temperature higher than 623 k is applied to one of or both of the magnetization free layer 7 and the magnetization fixed layer 5, if the above amorphous ferromagnetic material is applied to, in particular, the magnetization free layer 7, the effects can be achieved more remarkably.

It is needless to say that any materials which are generally used in this kind of magnetoresistive effect element can be used as ferromagnetic layers other than the ferromagnetic layers containing the amorphous ferromagnetic material having crystallization temperature higher than 623 K.

According to the above-mentioned embodiment, since at least one of the magnetization fixed layer 5 and the magnetization free layer 7 that are the pair of ferromagnetic layers comprising the ferromagnetic tunnel junction 9 contains the amorphous ferromagnetic material having crystallization temperature higher than 623 K, the magnetic element has excellent magnetic characteristic such as a TMR ratio (magnetoresistive changing rate) by the amorphous ferromagnetic material and hence a heat-resisting property of the amorphous ferromagnetic material is improved. Therefore, even when the magnetic element is annealed at temperature of about 623 K (300° C.) of a semiconductor circuit process in the manufacturing process, the magnetic characteristic such as the TMR ratio can be prevented from being deteriorated.

The present invention is not limited to the TMR element 1 in which the magnetization fixed layer 5 and the magnetization free layer 7 shown in FIG. 1 are composed of single layers, respectively.

Figure 2:
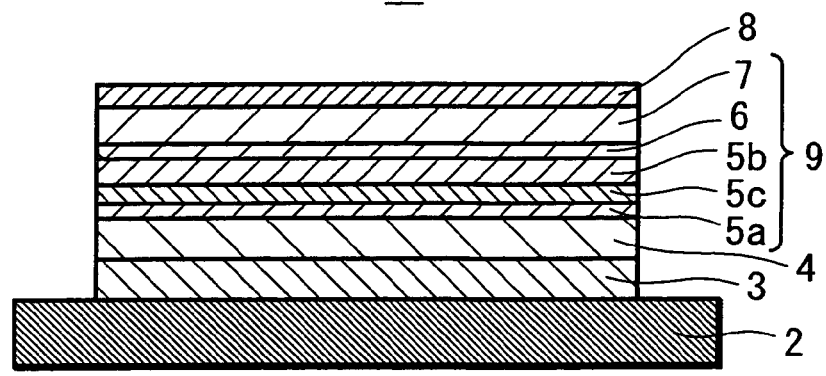
FIG. 2 is a schematic diagram showing a TMR element having a lamination layer ferri-strucutre.

As shown in FIG. 2, for example, effects of the present invention can be achieved even when the magnetic element has a synthetic ferrimagnet structure in which a magnetization fixed layer 5 includes a non-magnetic conductive layer 5c sandwiched by first and second magnetization fixed layers 5a and 5b.

In a TMR element 10 shown in FIG. 2, the first magnetization fixed layer 5a adjoins with the antiferromagnetic layer 4, and the first magnetization fixed layer 5a is given strong magnetic anisotropy of one direction by exchange interaction acting on these two layers. Also, the second magnetization fixed layer 5b is opposed to the magnetization free layer 7 through the tunnel barrier layer 6, and the spin direction thereof is compared with that of the magnetization free layer 7 to become a ferromagnetic layer directly concerning an MR ratio. Thus, the second magnetization fixed layer is referred to as a "reference layer".

Materials such as Ru, Rh, Ir, Cu, Cr, Au and Ag are available as the material for use in the non-magnetic dielectric layer 5c having the lamination layer structure. In the TMR element 10 shown in FIG. 2, since other layers have structures substantially similar to those of the TMR element 1 shown in FIG. 1, their elements and parts are denoted by the identical reference numerals, and therefore need not be described in detail.

Also in the TMR element 10 having this synthetic ferrimagnet structure, at least one of the magnetization fixed layer 5 and the magnetization free layer 7 contains the amorphous ferromagnetic material with crystallization temperature higher than 623 K, whereby a heat-resisting property can be improved and a high TMR ratio can be maintained even after it has been annealed at about 350° C. in a suitable process such as a semiconductor process similarly to the TMR element 1 shown in FIG. 1.

While the TMR elements (tunnel magnetoresistive effect elements) 1, 10 are used as the magnetoresistive effect element in the above-mentioned embodiment, the present invention can also be applied to other magnetoresistive effect element having an arrangement in which a pair of ferromagnetic layers are opposed to each other through an intermediate layer to cause an electric current to flow in the direction perpendicular to the layer surface to obtain magnetoresistive change.

For example, the present invention can also be applied to a giant magnetoresistive effect element (GMR element) using a non-magnetic conductive layer such as Cu as an intermediate layer to cause an electric current to flow in the direction perpendicular to the layer surface to obtain magnetoresistive effect, i.e., so-called CPP type GMR element.

Further, in the TMR element of the present invention, materials of the magnetization fixed layer and the antiferromagnetic body, the existence of the antiferromagnetic material layer and the existence of the synthetic ferrimagnet structure on the magnetization fixed layer side can be variously modified without losing the essence of the present invention.

The magnetoresistive effect element such as the above-mentioned TMR elements 1, 10 is suitable for use with a magnetic memory device such as an MRAM. The MRAM using the TMR element according to the present invention will be described below with reference to the drawings.

Figure 3:
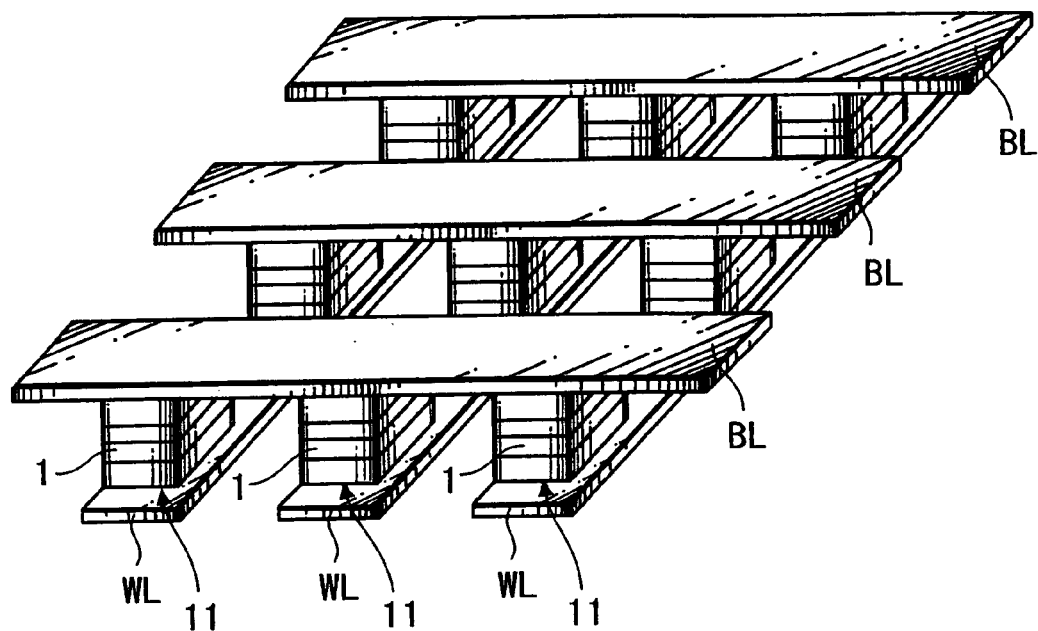
FIG. 3 is a schematic cross-sectional view showing a main portion of a cross-point type MRAM including the TMR element according to the present invention as a memory cell.

A cross-point type MRAM array having the TMR element according to the present invention is shown in FIG. 3. This MRAM includes a plurality of word lines WL and a plurality of bit lines BL perpendicular to these word lines WL, and also includes a memory cell 11 having the TMR element of the present invention at an intersecting point between the word line WL and the bit line BL. More specifically, in this MRAM array, 3×3 memory cells are disposed in a matrix fashion.

The TMR element for use with the MRAM array is not limited to the TMR element 1 shown in FIG. 1 and may be applied to other magnetoresistive effect element having any arrangement to cause an electric current to flow in the direction perpendicular to the layer surface to obtain magnetoresistive change, such as the TMR element 10 having the synthetic ferrimagnet structure shown in FIG. 2 so long as more than one layer of the ferromagnetic layer may contain amorphous ferromagnetic material having crystallization temperature higher than 623 K.

Figure 4:
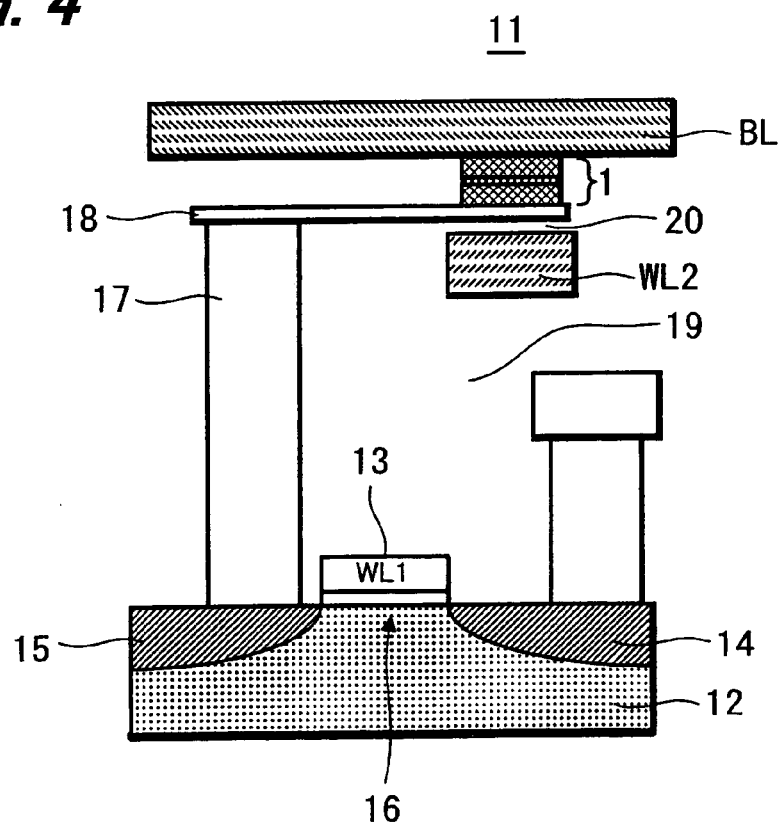
FIG. 4 is a cross-sectional view showing the memory cell shown in FIG. 3 in an enlarged-scale.

One memory cell is picked up from a large number of memory cells of a memory element and its cross-sectional structure is shown in FIG. 4.

As shown in FIG. 4, each memory cell 11 includes a silicon substrate 12, for example, on which there is formed a transistor 16 composed of a gate electrode 13, a source region 14 and a drain region 15. The gate electrode 13 comprises a read word line Wl1. A write word line (equivalent to the aforementioned word line) WL2 is formed on the gate electrode 13 through an insulating layer. A contact metal 17 is connected to the drain region 15, and an underlayer 18 is further connected to the contact metal 17. The TMR element 1 according to the present invention is formed on this underlayer 18 at its position corresponding to the upper portion of the write word line WL2. A bit line (equivalent to the aforementioned bit write line) BL which is perpendicular to the word lines WL1 and WL2 is formed on this TMR element 1. The underlayer 18 plays a role of electrically connecting the TMR element 1 and the drain region 15, which are placed at different positions on the plane, and is therefore referred to as a "bypass".

This memory cell further includes interlayer insulators 19 and 20 for use in insulating the respective word lines WL1, WL2 and the TMR element 1 and a passivation film (not shown) for protecting the whole of the memory cell.

Since this MRAM uses the TMR element 1 having the arrangement in which at least one of the ferromagnetic layers of the magnetization fixed layer 5 and the magnetization free layer 7 contains the amorphous ferromagnetic material with crystallization temperature higher than 623 K, a heat-resisting property of the ferromagnetic layer of the TMR element 1 can be improved, the TMR ratio of the TMR element 1 can be suppressed from being deteriorated due to annealing and this element has high TMR ratio. Hence, the TMR element 1 generates an excellent output, a high resistance state and a low resistance state can be distinguished from each other easily when information is read out from the memory cell, and an error rate can be decreased. Thus, this memory cell has a satisfactory read characteristic and a stability of memory operation can be improved considerably.

Inventive Examples

Specific inventive examples to which the present invention can be applied will be described below with reference to the results of experiments.

Figure 5:
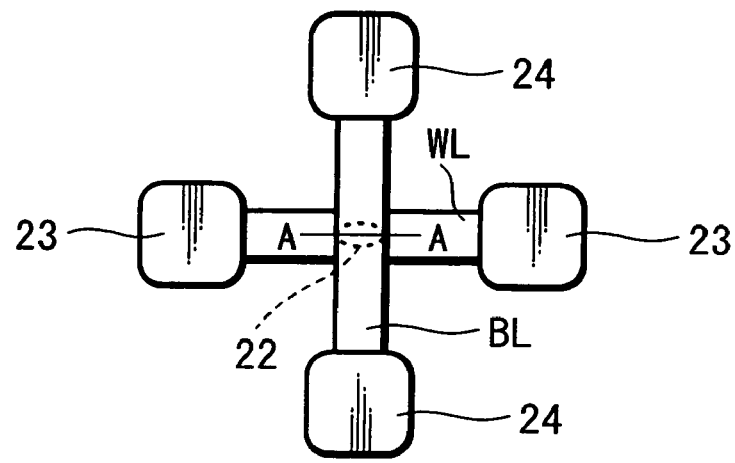
FIG. 5 is a plan view of a TEG for use in estimating a TMR element.
Figure 6:
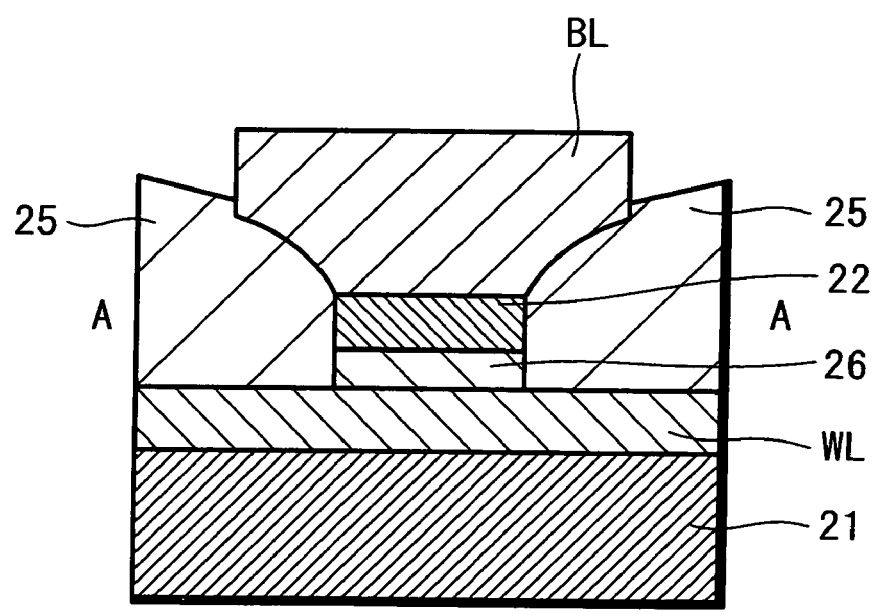
FIG. 6 is a cross-sectional view taken along the line A—A in FIG. 5.

Although the MRAM has a switching transistor 16 other than the TMR element 1 as shown in FIG. 4, in these inventive examples, in order to examine TMR characteristics, characteristics of a wafer in which only a ferromagnetic tunnel junction is formed as shown in FIGS. 5 and 6 were measured and estimated.

(Experiment 1)

First, magnetic characteristics of magnetic elements having the ferromagnetic layers comprising the ferromagnetic tunnel junction, i.e., the magnetization fixed layer and the magnetization free layer being formed of crystal ferromagnetic materials or amorphous ferromagnetic materials were examined.

<Sample 1>

As shown in FIGS. 5 and 6, a structure having a substrate 21 with a word line WL and a bit line BL disposed thereon at a right angle and a TMR element 22 formed at a portion in which these word line WL and bit line BL cross each other was manufactured as a characteristic estimation element TEG (Test Element Group). This TEG has an arrangement in which the TMR element 22 is shaped like an ellipse with a minor axis of 0.5 μm and a major axis of 1.0 μm, terminal pads 23, 24 are respectively formed at both ends of the word line WL and the bit line BL and in which the word line WL and the bit line BL are electrically insulated from each other by insulating films 25, 26 made of $Al_2O_3$.

More specifically, the TEG shown in FIGS. 5 and 6 was manufactured as follows.

First, there was prepared a 0.6 mm-thick silicon substrate 21 with a heat oxide film (having a thickness of 2 μm) deposited on the surface thereof.

Next, after a word line material has been deposited on this substrate 21 and masked by photolithography, other portion than the word line was selectively etched by Ar laser plasma and thereby the word line WL was formed. At that time, other area than the word line WL was etched up to the depth of 5 nm of the substrate 2.

After that, an insulating film 26 was formed so as to cover the word line WL and the surface was made flat by planarization.

Subsequently, the TMR element 22 having the following layer arrangement was manufactured by well-known lithography and etching. In this layer arrangement, the left-hand side of slash indicates the substrate side and numerical values within the parentheses indicate film thicknesses.

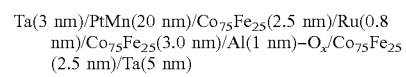

Ta(3 nm)/PtMn(20 nm)/$Co_{75}Fe_{25}$(2.5 nm)/Ru(0.8 nm)/$Co_{75}Fe_{25}$(3.0 nm)/Al(1 nm)–$O_x$/$Co_{75}Fe_{25}$ (2.5 nm)/Ta(5 nm)

The Al—$O_x$ film of the tunnel barrier layer 6 was formed by plasma-oxidizing a metal Al film with plasma from ICP (inducted coupling plasma) at oxygen/argon flow rate of 1:1 and chamber gas pressure of 0.1 mTorr after the metal Al film having a thickness of 1 nm has been deposited by a DC sputtering method. An oxidation time may be changed depending upon ICP plasma output, and it was selected to be 30 seconds in this inventive example.

Other films than the Al—$O_x$ film of the tunnel barrier layer 6 were deposited by a DC magnetron sputtering method.

Next, the resultant product was annealed by annealing at 270° C. for 4 hours in the magnetic field of 10 kOe by a field anneal furnace, and a ferromagnetic tunnel junction 9 was formed by normalizing-anneal of a PtMn layer which is an antiferromagnetic layer.

After that, the TMR element 22 having the flat surface pattern shown in FIG. 5 was formed by patterning the TMR element 22 and the insulating film 26 disposed under this element.

Further, an insulating film 25 having a thickness of about 100 nm was deposited by sputtering the $Al_2O_3$ film and the bit line BL and the terminal pad 24 were formed by photolithography, thereby resulting in the TEG shown in FIGS. 5 and 6 being obtained.

<Sample 2>

A TEG was obtained similarly to the sample 1 except that the layer arrangement of the TMR element 22 was changed as follows.

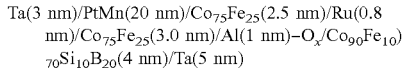
Ta(3 nm)/PtMn(20 nm)/Co$_{75}$Fe$_{25}$(2.5 nm)/Ru(0.8 nm)/Co$_{75}$Fe$_{25}$(3.0 nm)/Al(1 nm)–O$_x$/(Co$_{90}$Fe$_{10}$)$_{70}$Si$_{10}$B$_{20}$(4 nm)/Ta(5 nm)

<Sample 3>

A TEG was obtained similarly to the sample 1 except that the layer arrangement of the TMR element 22 was changed as follows.

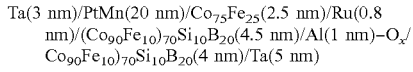
Ta(3 nm)/PtMn(20 nm)/Co$_{75}$Fe$_{25}$(2.5 nm)/Ru(0.8 nm)/(Co$_{90}$Fe$_{10}$)$_{70}$Si$_{10}$B$_{20}$(4.5 nm)/Al(1 nm)–O$_x$/(Co$_{90}$Fe$_{10}$)$_{70}$Si$_{10}$B$_{20}$(4 nm)/Ta(5 nm)

<Sample 4>

A TEG was obtained similarly to the sample 1 except that the layer arrangement of the TMR element 22 was changed as follows.

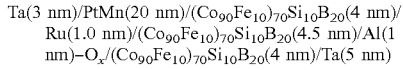
Ta(3 nm)/PtMn(20 nm)/(Co$_{90}$Fe$_{10}$)$_{70}$Si$_{10}$B$_{20}$(4 nm)/Ru(1.0 nm)/(Co$_{90}$Fe$_{10}$)$_{70}$Si$_{10}$B$_{20}$(4.5 nm)/Al(1 nm)–O$_x$/(Co$_{90}$Fe$_{10}$)$_{70}$Si$_{10}$B$_{20}$(4 nm)/Ta(5 nm)

<Sample 5>

A TEG was obtained similarly to the sample 1 except that the layer arrangement of the TMR element 22 was changed as follows.

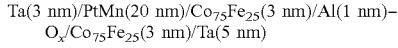
Ta(3 nm)/PtMn(20 nm)/Co$_{75}$Fe$_{25}$(3 nm)/Al(1 nm)–O$_x$/Co$_{75}$Fe$_{25}$(3 nm)/Ta(5 nm)

While the samples 1 to 4 had the layer arrangement in which the magnetization fixed layer has the synthetic ferrimagnet structure, the layer arrangement of this sample 5 does not have the synthetic ferrimagnet structure.

<Sample 6>

A TEG was obtained similarly to the sample 1 except that the layer arrangement of the TMR element 22 was changed as follows.

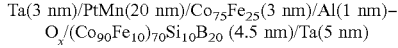
Ta(3 nm)/PtMn(20 nm)/Co$_{75}$Fe$_{25}$(3 nm)/Al(1 nm)–O$_x$/(Co$_{90}$Fe$_{10}$)$_{70}$Si$_{10}$B$_{20}$(4.5 nm)/Ta(5 nm)

<Sample 7>

A TEG was obtained similarly to the sample 1 except that the layer arrangement of the TMR element 2 was changed as follows.

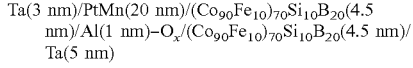
Ta(3 nm)/PtMn(20 nm)/(Co$_{90}$Fe$_{10}$)$_{70}$Si$_{10}$B$_{20}$(4.5 nm)/Al(1 nm)–O$_x$/(Co$_{90}$Fe$_{10}$)$_{70}$Si$_{10}$B$_{20}$(4.5 nm)/Ta(5 nm)

<Sample 8>

A TEG was obtained similarly to the sample 1 except that the layer arrangement of the TMR element 22 was changed as follows.

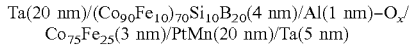
Ta(20 nm)/(Co$_{90}$Fe$_{10}$)$_{70}$Si$_{10}$B$_{20}$(4 nm)/Al(1 nm)–O$_x$/Co$_{75}$Fe$_{25}$(3 nm)/PtMn(20 nm)/Ta(5 nm)

More specifically, this sample 8 has an arrangement in which the magnetization free layer is formed on the substrate side, the magnetization fixed layer side having the synthetic ferrimagnet structure.

<Sample 9>

A TEG was obtained similarly to the sample 1 except that the layer arrangement of the TMR element 22 was changed as follows.

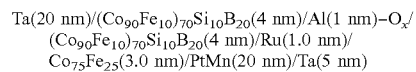
Ta(20 nm)/(Co$_{90}$Fe$_{10}$)$_{70}$Si$_{10}$B$_{20}$(4 nm)/Al(1 nm)–O$_x$/(Co$_{90}$Fe$_{10}$)$_{70}$Si$_{10}$B$_{20}$(4 nm)/Ru(1.0 nm)/Co$_{75}$Fe$_{25}$(3.0 nm)/PtMn(20 nm)/Ta(5 nm)

(Experiment 2)

The magnetization fixed layer had a synthetic ferrimagnet structure comprising two layers of CoFe and Ru, and the magnetization free layer was formed as a ferromagnetic layer having a composition in which Si or B was added to CoFe. Then, optimum ranges of the added amount of B and the added amount of Si were checked.

<Sample 10>

The layer arrangement of the TMR element 22 was selected to be the following layer arrangement (1).

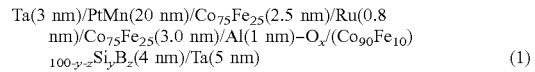
Ta(3 nm)/PtMn(20 nm)/Co$_{75}$Fe$_{25}$(2.5 nm)/Ru(0.8 nm)/Co$_{75}$Fe$_{25}$(3.0 nm)/Al(1 nm)–O$_x$/(Co$_{90}$Fe$_{10}$)$_{100-y-z}$Si$_y$B$_z$(4 nm)/Ta(5 nm)     (1)

In the above-described layer arrangement (1), y and z of (Co$_{90}$Fe$_{10}$)$_{100-x-y}$Si$_y$B$_z$ indicate composition ratios of atomic % and (Co$_{90}$Fe$_{10}$) within the parenthesis shows that Co and Fe have a composition ratio of 90:10. If y=10 atomic % and z=10 atomic % are established, then (Co$_{90}$Fe$_{10}$)$_{80}$Si$_{10}$B$_{10}$ is satisfied. This indicates that CoFe alloy having a composition ratio of Co:Fe=90 atomic %:10 atomic % has 80 atomic % and has a composition ratio in which Si is 10 atomic % and B is 10 atomic %. Accordingly, a composition ratio of each element expresses Co$_{72}$Fe$_8$Si$_{10}$B$_{10}$.

Then, this sample 10 has y=0 and z=10 atomic %, i.e., composition of (Co$_{90}$Fe$_{10}$)$_{90}$B$_{10}$ in the above-described layer arrangement (1). Except for the above-described composition, a TEG was obtained similarly to the sample 1.

<Sample 11>

A TEG was obtained similarly to the sample 10 except that the magnetization free layer has a composition of y=0 and z=15 atomic %, i.e., (Co$_{90}$Fe$_{10}$)$_{85}$B$_{15}$.

<Sample 12>

A TEG was obtained similarly to the sample 10 except that the magnetization free layer has a composition of y=0 and z=20 atomic %, i.e., (Co$_{90}$Fe$_{10}$)$_{80}$B$_{20}$.

<Sample 13>

A TEG was obtained similarly to the sample 10 except that the magnetization free layer has a composition of y=0 and z=25 atomic %, i.e., Co$_{90}$Fe$_{10}$)$_{75}$B$_{25}$.

<Sample 14>

A TEG was obtained similarly to the sample 10 except that the magnetization free layer has a composition of y=0 and z=30 atomic %, i.e., (Co$_{90}$Fe$_{10}$)$_{70}$B$_{30}$.

<Sample 15>

A TEG was obtained similarly to the sample 10 except that the magnetization free layer has a composition of y=0 and z=35 atomic %, i.e., (Co$_{90}$Fe$_{10}$)$_{65}$B$_{35}$.

<Sample 16>

A TEG was obtained similarly to the sample 10 except that the magnetization free layer has a composition of y=2.5 atomic % and z=15 atomic %, i.e., (Co$_{90}$Fe$_{10}$)$_{82.5}$Si$_{2.5}$B$_{15}$.

<Sample 17>
A TEG was obtained similarly to the sample 10 except that the magnetization free layer has a composition of y=2.5 atomic % and z=20 atomic %, i.e., $(Co_{90}Fe_{10})_{77.5}Si_{2.5}B_{20}$.

<Sample 18>
A TEG was obtained similarly to the sample 10 except that the magnetization free layer has a composition of y=5 atomic % and z=10 atomic %, i.e., $(Co_{90}Fe_{10})_{85}Si_5B_{10}$.

<Sample 19>
A TEG was obtained similarly to the sample 10 except that the magnetization free layer has a composition of y=5 atomic % and z=15 atomic %, i.e., $(Co_{90}Fe_{10})_{80}Si_5B_{15}$.

<Sample 20>
A TEG was obtained similarly to the sample 10 except that the magnetization free layer has a composition of y=5 atomic % and z=20 atomic %, i.e., $(Co_{90}Fe_{10})_{75}Si_5B_{20}$.

<Sample 21>
A TEG was obtained similarly to the sample 10 except that the magnetization free layer has a composition of y=5 atomic % and z=25 atomic %, i.e., $(Co_{90}Fe_{10})_{70}Si_5B_{25}$.

<Sample 22>
A TEG was obtained similarly to the sample 10 except that the magnetization free layer has a composition of y=10 atomic % and z=0, i.e., $(Co_{90}Fe_{10})_{90}Si_{10}$.

<Sample 23>
A TEG was obtained similarly to the sample 10 except that the magnetization free layer has a composition of y=10 atomic % and z=5 atomic %, i.e., $(Co_{90}Fe_{10})_{85}Si_{10}B_5$.

<Sample 24>
A TEG was obtained similarly to the sample 10 except that the magnetization free layer has a composition of y=10 atomic % and z=10 atomic %, i.e., $(Co_{90}Fe_{10})_{80}Si_{10}B_{10}$.

<Sample 25>
A TEG was obtained similarly to the sample 10 except that the magnetization free layer has a composition of y=10 atomic % and z=15 atomic %, i.e., $(Co_{90}Fe_{10})_{75}Si_{10}B_{15}$.

<Sample 26>
A TEG was obtained similarly to the sample 10 except that the magnetization free layer has a composition of y=10 atomic % and z=20 atomic %, i.e., $(Co_{90}Fe_{10})_{70}Si_{10}B_{20}$.

<Sample 27>
A TEG was obtained similarly to the sample 10 except that the magnetization free layer has a composition of y=10 atomic % and z=25 atomic %, i.e., $(Co_{90}Fe_{10})_{65}Si_{10}B_{25}$.

<Sample 28>
A TEG was obtained similarly to the sample 10 except that the magnetization free layer has a composition of y=10 atomic % and z=30 atomic %, i.e., $(Co_{90}Fe_{10})60Si_{10}B_{30}$.

<Sample 29>
A TEG was obtained similarly to the sample 10 except that the magnetization free layer has a composition of y=15 atomic % and z=5 atomic %, i.e., $(Co_{90}Fe_{10})_{85}Si_{15}B_5$.

<Sample 30>
A TEG was obtained similarly to the sample 10 except that the magnetization free layer has a composition of y=15 atomic % and z=10 atomic %, i.e., $(Co_{90}Fe_{10})_{75}Si_{15}B_{10}$.

<Sample 31>
A TEG was obtained similarly to the sample 10 except that the magnetization free layer has a composition of y=15 atomic % and z=15 atomic %, i.e., $(Co_{90}Fe_{10})_{70}Si_{15}B_{15}$.

<Sample 32>
A TEG was obtained similarly to the sample 10 except that the magnetization free layer has a composition of y=15 atomic % and z=20 atomic %, i.e., $(Co_{90}Fe_{10})_{65}Si_{15}B_{20}$.

<Sample 33>
A TEG was obtained similarly to the sample 10 except that the magnetization free layer has a composition of y=15 atomic % and z=25 atomic %, i.e., $(Co_{90}Fe_{10})_{60}Si_{15}B_{25}$.

<Sample 34>
A TEG was obtained similarly to the sample 10 except that the magnetization free layer has a composition of y=20 atomic % and z=0, i.e., $(Co_{90}Fe_{10})_{80}Si_{20}$.

<Sample 35>
A TEG was obtained similarly to the sample 10 except that the magnetization free layer has a composition of y=20 atomic % and z=5 atomic %, i.e., $(Co_{90}Fe_{10})_{75}Si_{20}B_5$.

<Sample 36>
A TEG was obtained similarly to the sample 10 except that the magnetization free layer has a composition of y=20 atomic % and z=10 atomic %, i.e., $(Co_{90}Fe_{10})_{70}Si_{20}B_{10}$.

<Sample 37>
A TEG was obtained similarly to the sample 10 except that the magnetization free layer has a composition of y=20 atomic % and z=15 atomic %, i.e., $(Co_{90}Fe_{10})_{65}Si_{20}B_{15}$.

<Sample 38>
A TEG was obtained similarly to the sample 10 except that the magnetization free layer has a composition of y=20 atomic % and z=20 atomic %, i.e., $(Co_{90}Fe_{10})_{60}Si_{20}B_{20}$.

<Sample 39>
A TEG was obtained similarly to the sample 10 except that the magnetization free layer has a composition of y=25 atomic % and z=5 atomic %, i.e., $(Co_{90}Fe_{10})_{70}Si_{25}B_5$.

<Sample 40>
A TEG was obtained similarly to the sample 10 except that the magnetization free layer has a composition of y=25 atomic % and z=10 atomic %, i.e., $(Co_{90}Fe_{10})_{65}Si_{25}B_{10}$.

<Sample 41>
A TEG was obtained similarly to the sample 10 except that the magnetization free layer has a composition of y=25 atomic % and z=15 atomic %, i.e., $(Co_{90}Fe_{10})_{60}Si_{25}B_{15}$.

(Experiment 3)
A magnetization free layer has a synthetic ferrimagnet structure comprising two layers of CoFe and Ru, and a magnetization free layer was formed as a ferromagnetic layer having a composition in which Si and B were added to (Co, Fe). Then, an optimum range of Fe content was checked.

<Sample 42>
A TEG was obtained similarly to the sample 10 except that the magnetization free layer has a composition of $(Co_{100-x}Fe_x)_{70}Si_{10}B_{20}$, further x=0, i.e., a composition of $Co_{70}Si_{10}B_{20}$ in the layer arrangement (1).

<Sample 43>
A TEG was obtained similarly to the sample 42 except that the magnetization free layer has a composition of x=5 atomic %, i.e., a composition of $(Co_{95}Fe_5)_{70}Si_{10}B_{20}$.

<Sample 44>
A TEG was obtained similarly to the sample 42 except that the magnetization free layer has a composition of x=10 atomic %, i.e., a composition of $(Co_{90}Fe_{10})_{70}Si_{10}B_{20}$.

<Sample 45>
A TEG was obtained similarly to the sample 42 except that the magnetization free layer has a composition of x=25 atomic %, i.e., a composition of $(Co_{75}Fe_{25})_{70}Si_{10}B_{20}$.

<Sample 46>
A TEG was obtained similarly to the sample 42 except that the magnetization free layer has a composition of x=40 atomic %, i.e., a composition of $(Co_{60}Fe_{40})_{70}Si_{10}B_{20}$.

<Sample 47>
A TEG was obtained similarly to the sample 42 except that the magnetization free layer has a composition of x=50 atomic %, i.e., a composition of $(Co_{50}Fe_{50})_{70}Si_{10}B_{20}$.

<Sample 48>
A TEG was obtained similarly to the sample 42 except that the magnetization free layer has a composition of x=70 atomic %, i.e., a composition of $(Co_{30}Fe_{70})_{70}Si_{10}B_{20}$.

(Experiment 4)
A magnetization fixed layer has a synthetic ferrimagnet structure comprising two layers of CoFe and Ru and a magnetization free layer was formed as a ferromagnetic layer having a composition in which Si and B were added to (Co, Fe, Ni). Then, optimum ranges of Fe content and Ni content were checked.

<Sample 49>
A TEG was obtained similarly to the sample 10 except that a magnetization free layer has a composition of $(Co_{100-x-w}Fe_xNi_w)_{70}Si_{10}B_{20}$, further x=6 atomic %, w=40 atomic %, i.e., a composition of $(Co_{54}Fe_6Ni_{40})_{70}Si_{10}B_{20}$.

<Sample 50>
A TEG was obtained similarly to the sample 49 except that the magnetization free layer has x=15 atomic %, w=40 atomic %, i.e., a composition of $(Co_{45}Fe_{15}Ni_{40})_{70}Si_{10}B_{20}$.

<Sample 51>
A TEG was obtained similarly to the sample 49 except that the magnetization free layer has x=6.5 atomic %, w=35 atomic %, i.e., a composition of $(Co_{58.5}Fe_{6.5}Ni_{35})_{70}Si_{10}B_{20}$.

<Sample 52>
A TEG was obtained similarly to the sample 49 except that the magnetization free layer has x=16.25 atomic %, w=35 atomic %, i.e., a composition of $(Co_{48.75}Fe_{16.25}Ni_{35})_{70}Si_{10}B_{20}$.

<Sample 53>
A TEG was obtained similarly to the sample 49 except that the magnetization free layer has x=7 atomic %, w=30 atomic %, i.e., a composition of $(Co_{63}Fe_7Ni_{30})_{70}Si_{10}B_{20}$.

<Sample 54>
A TEG was obtained similarly to the sample 49 except that the magnetization free layer has x=17.5 atomic %, w=30 atomic %, i.e., a composition of $(Co_{52.5}Fe17.5Ni_{30})_{70}Si_{10}B_{20}$.

<Sample 55>
A TEG was obtained similarly to the sample 49 except that the magnetization free layer has x=8 atomic %, w=20 atomic %, i.e., a composition of $(Co_{72}Fe_8Ni_{20})_{70}Si_{10}B_{20}$.

<Sample 56>
A TEG was obtained similarly to the sample 49 except that the magnetization free layer has x=20 atomic %, w=20 atomic %, i.e., a composition of $(Co_{60}Fe_{20}Ni_{20})_{70}Si_{10}B_{20}$.

<Sample 57>
A TEG was obtained similarly to the sample 49 except that the magnetization free layer has x=9 atomic %, w=10 atomic %, i.e., a composition $(Co_{81}Fe_9Ni_{10})_{70}Si_{10}B_{20}$.

<Sample 58>
A TEG was obtained similarly to the sample 49 except that the magnetization free layer has x=22.5 atomic %, w=10 atomic %, i.e., a composition of $(Co_{67.5}Fe_{22.5}Ni_{10})_{70}Si_{10}B_{20}$.

<Sample 59>
A TEG was obtained similarly to the sample 49 except that the magnetization free layer has x=10 atomic %, w=0, i.e., a composition of $(Co_{90}Fe_{10})_{70}Si_{10}B_{20}$.

<Sample 60>
A TEG was obtained similarly to the sample 49 except that the magnetization free layer has x=25 atomic %, w=0, i.e., a composition of $(Co_{75}Fe_{25})_{70}Si_{10}B_{20}$.

(Experiment 5)
A magnetization fixed layer had a synthetic ferrimagnet structure comprising two layers of CoFe and Ru, and a magnetization free layer had a composition in which various elements were added to (Co, Fe). Then, characteristics thereof were checked.

<Sample 61>
A TEG was obtained similarly to the sample 10 except that the magnetization free layer has a composition of $Co_{70.3}Fe_{4.7}P_{13}C_7$ (atomic %).

<Sample 62>
A TEG was obtained similarly to the sample 10 except that the magnetization free layer has a composition of $Co_{72}Fe_3P_{16}B_6Al_{13}$ (atomic %).

<Sample 63>
A TEG was obtained similarly to the sample 10 except that the magnetization free layer has a composition of $Co_{69.6}Fe_{4.6}Mo_{1.8}Si_8B_{16}$ (atomic %).

<Sample 64>
A TEG was obtained similarly to the sample 10 except that the magnetization free layer has a composition of $Co_{74.3}Fe_{2.6}Mn_{3.1}Si_4B_{16}$ (atomic %).

<Sample 65>
A TEG was obtained similarly to the sample 10 except that the magnetization free layer has a composition of $Co_{70}Mn_6B_{24}$ (atomic %).

<Sample 66>
A TEG was obtained similarly to the sample 10 except that the magnetization free layer has a composition of $Co_{81.5}Mo_{9.5}Zr_9$ (atomic %).

Then, TMR ratios were calculated from TEGs of the thus obtained respective samples 1 to 66 by the following methods. Further, amorphous substance phases were identified, and crystallization temperatures were measured.

TMR Ratio

While an ordinary magnetic memory device such as an MRAM is adapted to write information therein by inverting the magnetization direction of the magnetoresistive effect element with application of an electric current magnetic field, according to this inventive example, a resistance value was measured by magnetizing the magnetoresistive effect element with application of an external magnetic field. More specifically, first, an external magnetic field for inverting the magnetization direction of the magnetization free layer of the TMR element 22 was applied to the magnetization free layer in parallel to the easy axis of magnetization of the magnetization free layer. A magnitude of an external magnetic field for measuring a resistance value was 500 Oe.

Next, at the same time the external magnetic field is applied to the magnetization free layer in a range of from −500 Oe to +500 Oe as seen from one side of the easy axis of magnetization of the magnetization free layer, a tunnel electric current is caused to flow through the ferromagnetic tunnel junction while a bias voltage applied to the terminal pad 23 of the word line WL and the terminal pad 24 of the bit line BL is being adjusted such that the bias voltage may reach 100 mV. Resistance values obtained against respective external magnetic fields at that time were measured. Then, a resistance value obtained in the state in which the magnetization directions of the magnetization fixed layer and the magnetization free layer are anti-parallel, resistance values being high and a resistance value obtained in the state in which the magnetization directions of the magnetization fixed layer and the magnetization free layer are parallel to each other, resistance values being low were calculated. Then, TMR ratios (magnetoresistive changing rates) were calculated from these resistance values.

(Identification of Amorphous Substance Phase)

Miniscule structures of ferromagnetic materials according to the inventive examples were observed by a transmission electron microscope (TEM) and an X-ray diffraction.

Since X-rays pass through a film thickness region of about 5 nm comprising the above-mentioned ferromagnetic tunnel junction or a thinner film thickness region and the film thickness in these film thickness ranges is not sufficient to obtain diffraction patterns, a ferromagnetic material single layer film with a film thickness of 500 nm having the same composition as that of the magnetization free layer of each sample was measured as a new sample for identifying the amorphous substance phase through X-ray diffraction and then measured. Through the X-ray diffraction patterns, only broad peaks were observed on the low angle side and diffraction peak of crystal layer is not observed. In the TEM observation, samples from which halo rings have been observed by electron ray diffraction images were identified as amorphous substance structures.

(Measurement of Crystallization Temperature)

Crystallization temperatures were measured when resistance values were measured by a 4-terminal method in a vacuum anneal furnace, Although resistance values are changed considerably before and after crystallization, temperature at which this resistance change was observed clearly was normalized as "crystallization temperature". In the layer arrangement of the TMR element in actual practice, since it is difficult to measure crystallization temperature of ferromagnetic material similarly to the X-ray diffraction, new measurement samples having a film thickness of 100 nm were manufactured under the same conditions as those in which the TMR layer arrangement is deposited as samples for use in measuring crystallization temperature.

(Relationship Between TMR Layer Arrangement and Heat-resisting Property)

First, a relationship between an optimum layer arrangement and a heat-resisting property obtained when $(Co_{90}Fe_{10})_{70}Si_{10}B_{20}$ was used as an amorphous ferromagnetic material having crystallization temperature higher than 623 K will be described with reference to the estimated results of <samples 1 to 9>.

It was identified by X-ray diffraction and TEM that this $(Co_{90}Fe_{10})_{70}Si_{10}B_{20}$ has an amorphous structure, and crystallization temperature is 800 K. In other words, this sample satisfies requirements of the present invention and falls within the present invention.

<Sample 1> includes a magnetization fixed layer composed of a PtMn antiferromagnetic layer and a synthetic ferrimagnet structure. A crystal ferromagnetic material $Co_{75}Fe_{25}$ is provided on a magnetization free layer, a first magnetization fixed layer (pinned layer) and a second magnetization fixed layer (reference layer) on an Al—$O_x$ insulating layer.

<Sample 2> has a magnetization fixed layer composed of a PtMn antiferromagnetic layer and a synthetic ferrimagnet structure, and a $(Co_{90}Fe_{10})_{70}Si_{10}B_{20}$ is provided on a magnetization free layer on an Al—$O_x$ tunnel insulating layer.

<Sample 3> has a magnetization fixed layer composed of a PtMn antiferromagnetic layer and a synthetic ferrimagnet structure, and a $(Co_{90}Fe_{10})_{70}Si_{10}B_{20}$ is provided on a magnetization free layer on an Al—$O_x$ tunnel insulating layer and a second magnetization fixed layer (reference layer) having a synthetic ferrimagnet structure.

<Sample 4> has a magnetization fixed layer composed of a PtMn antiferromagnetic layer and a synthetic ferrimagnet structure, and a $(Co_{90}Fe_{10})_{70}Si_{10}B_{20}$ is provided on a magnetization free layer on an Al—$O_x$ tunnel insulating layer, a first magnetization fixed layer (pinned layer) having a synthetic ferrimagnet structure and a second magnetization fixed layer (reference layer).

<Sample 5> has a magnetization fixed layer structure composed of a PtMn antiferromagnetic layer, and a crystal ferromagnetic material $Co_{75}Fe_{25}$ is provided on a magnetization free layer and a magnetization fixed layer on an Al—$O_x$ tunnel insulating layer.

<Sample 6> has a magnetization fixed layer structure composed of a PtMn antiferromagnetic layer, and a $(Co_{90}Fe_{10})_{70}Si_{10}B_{20}$ is provided on a magnetization free layer on an Al—$O_x$ tunnel insulating layer.

<Sample 7> has a magnetization fixed layer structure composed of a PtMn antiferromagnetic layer, and $(Co_{90}Fe_{10})_{70}Si_{10}B_{20}$ is provided on a magnetization free layer and a magnetization fixed layer on an Al—$O_x$ tunnel insulating layer.

<Sample 8> has a magnetization fixed layer composed of a PtMn antiferromagnetic layer and a synthetic ferrimagnet structure, a magnetization fixed layer having a synthetic ferrimagnet structure is provided above an Al—$O_x$ tunnel insulating layer and a $(Co_{90}Fe_{10})_{70}Si_{10}B_{20}$ is provided on a magnetization free layer located under the Al—$O_x$ tunnel insulating layer.

<Sample 9> has a magnetization fixed layer composed of a PtMn antiferromagnetic layer and a synthetic ferrimagnet structure, a magnetization fixed layer having a synthetic ferrimagnet structure is provided above an Al—$O_x$ tunnel insulating layer and a $(Co_{90}Fe_{10})_{70}Si_{10}B_{20}$ is provided on a magnetization free layer located under the Al—$O_x$ tunnel insulating layer and a magnetization fixed layer (in this case, reference layer) on the under side of the magnetization fixed layer having the synthetic ferrimagnet structure.

With respect to the samples 1 to 9, TMR ratios of manufactured TEGs (annealed at 270° C. for 4 hours), and TMR ratios of the manufactured TEGs that have been further annealed at 350° C. for 10 hours were measured.

These measured results are shown on the table 1.

TABLE 1

| Sample Nos. | Layer arrangement | Layer containing $(Co_{90}Fe_{10})_{70}Si_{10}B_{20}$ | TMR ratio (%) obtained after anneal at 270° C. for 4 hours | TMR ratio (%) obtained after anneal at 350° C. for 10 hours |
|---|---|---|---|---|
| 1 | Bottom-spin type, laminated layer structure | None | 44% | 10% |
| 2 | Bottom-spin type, laminated layer structure | Magnetization free layer | 54% | 45% |
| 3 | Bottom-spin type, laminated layer structure | Reference layer, magnetization free layer | 49% | 42% |
| 4 | Bottom-spin type, laminated layer structure | Pinned layer, reference layer, magnetization free layer | 47% | 42% |
| 5 | Bottom-spin type | None | 44% | 9% |
| 6 | Bottom-spin type | Magnetization free layer | 50% | 42% |
| 7 | Bottom-spin type | Pinned layer, magnetization free layer | 49% | 41% |
| 8 | Bottom-spin type, laminated layer structure | Magnetization free layer | 48% | 40% |
| 9 | Bottom-spin type, laminated layer structure | Magnetization free layer reference layer | 46% | 40% |

As shown on the table 1, it is to be understood from comparisons of the sample 1 with the samples 2 to 4 that, if any one layer or more than two layers of the ferromagnetic layer of the TMR element is made of an amorphous ferromagnetic material $(Co_{90}Fe_{10})_{70}Si_{10}B_{20}$ having crystallization temperature higher than 623 K which falls within the range of the present invention, then an amount in which TMR ratio is decreased by annealing at 350° C. is small and a heat-resisting efficiency can be improved.

Having considered the samples 2 to 4, it is to be noted that the magnetization free layer should preferably be made of only the amorphous ferromagnetic material according to the present invention as in the sample 2 in order to obtain higher TMR ratios and that high TMR ratios can be obtained under annealing conditions at relatively high temperature of 350° C.

Further, from the results of the samples 5 to 7, it is to be understood that a heat-resisting property can be improved by using the amorphous ferromagnetic material according to the present invention to make the ferromagnetic layer regardless of the existence of the synthetic ferrimagnet structure.

Similarly, from the results of the samples 8 to 9, it is to be understood that a heat-resisting property can be improved by using the amorphous ferromagnetic material according to the present invention to make the ferromagnetic layer even when the magnetic material has an arrangement (so-called top-spin type) in which a magnetization fixed layer is disposed on the upper side of the tunnel insulating layer.

More specifically, if any one layer or more than two layers of the ferromagnetic layer are made of the amorphous ferromagnetic material having crystallization temperature higher than 623 K, then regardless of the arrangement in which the magnetic element is of the so-called bottom-spin type or the top-spin type, effects for improving a heat-resisting property can be achieved. Also, effects for improving a heat-resisting property can be achieved regardless of the existence of the synthetic ferrimagnet structure.

Accordingly, the effects of the present invention can be achieved when one layer or more than two layers of the ferromagnetic layer are made of the amorphous ferromagnetic material having crystallization temperature higher than 623 K regardless of the existence of, in particular, the layer arrangement of the TMR element.

From a standpoint of obtaining the highest TMR ratio, based upon the comparison with the samples 2 to 4, it is to be understood that only the magnetization free layer should preferably be made of the amorphous ferromagnetic material according to the present invention when the magnetic element is of the bottom-spin type. Also, from the comparisons with the samples 2 and 6, it is to be noted that the magnetic element should preferably have the synthetic ferrimagnet structure. Further, from the comparisons with the samples 2 and 8, it is to be noted that magnetic element should preferably be of the bottom-spin type. Accordingly, it is to be understood from these results that the magnetic element should suitably be of the bottom-spin type with the synthetic ferrimagnet structure and that only the magnetization free layer should be made of the amorphous ferromagnetic material having crystallization temperature higher than 623 K.

(Composition Dependences of Si and B of TMR Element Using CoFe—Si—B Amorphous Ferromagnetic Material)

Any of the respective samples (samples 10 to 41) of the experiment 2 has an arrangement in which it is of the bottom-spin type with the synthetic ferrimagnet structure, only the magnetization free layer being made of the ferromagnetic material containing Co, Fe, Si and B.

Figure 7:
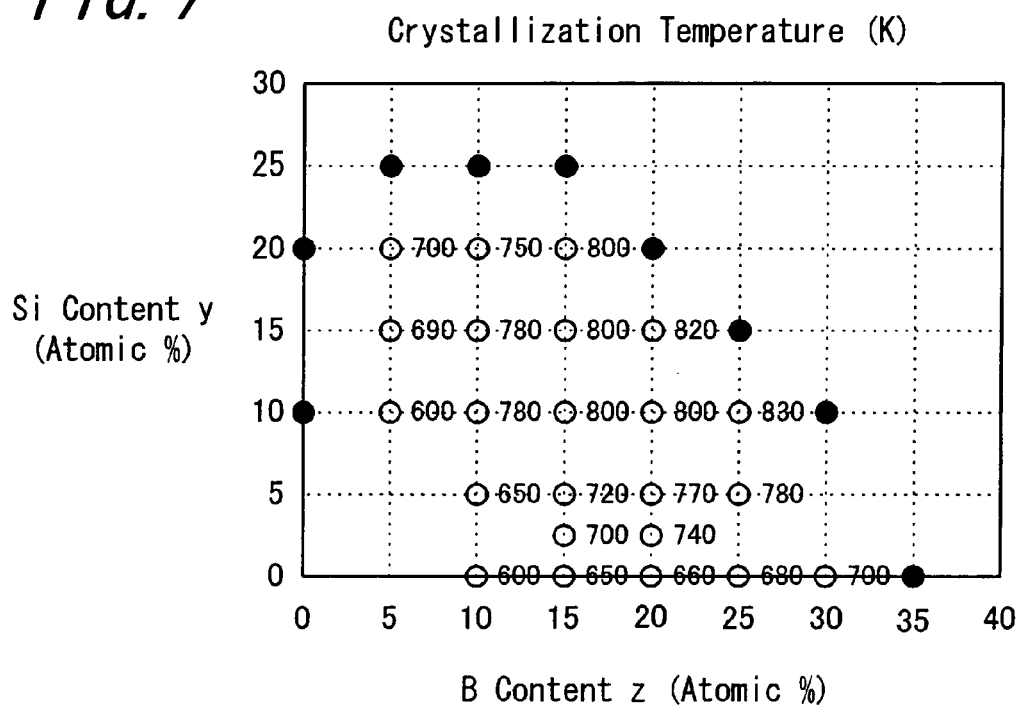
FIG. 7 is a diagram showing a relationship among Si content, B content and crystallization temperature.

Crystallization temperatures of the respective samples were measured and measured results are shown on the table 2. FIG. 7 shows relationships among Si content y (atomic %), B content z (atomic %) and crystallization temperatures (K).

Samples in which measured values of crystallization temperatures are shown by asterisks did not exhibit clear magnetoresistive change in the measurements of crystallization temperatures. From the results of the X-ray diffraction and the TEM observation, it is considered that mixed phase of crystal phase and amorphous phase or crystal phase may be obtained. These samples are shown by solid circles in FIG. 7.

TABLE 2

| Sample Nos. | Si content (atomic %) | B content (atomic %) | Crystallization temperature |
|---|---|---|---|
| 10 | 0 | 10 | 600 |
| 11 | 0 | 15 | 650 |
| 12 | 0 | 20 | 660 |
| 13 | 0 | 25 | 680 |
| 14 | 0 | 30 | 700 |
| 15 | 0 | 35 | * |
| 16 | 2.5 | 15 | 700 |
| 17 | 2.5 | 20 | 740 |
| 18 | 5 | 10 | 650 |
| 19 | 5 | 15 | 720 |
| 20 | 5 | 20 | 770 |
| 21 | 5 | 25 | 780 |
| 22 | 10 | 0 | * |
| 23 | 10 | 5 | 600 |
| 24 | 10 | 10 | 780 |
| 25 | 10 | 15 | 800 |
| 26 | 10 | 20 | 800 |
| 27 | 10 | 25 | 830 |
| 28 | 10 | 30 | * |
| 29 | 15 | 5 | 690 |
| 30 | 15 | 10 | 780 |
| 31 | 15 | 15 | 800 |
| 32 | 15 | 20 | 820 |
| 33 | 15 | 25 | * |
| 34 | 20 | 0 | * |
| 35 | 20 | 5 | 700 |
| 36 | 20 | 10 | 750 |
| 37 | 20 | 15 | 800 |
| 38 | 20 | 20 | * |
| 39 | 25 | 5 | * |
| 40 | 25 | 10 | * |
| 41 | 25 | 15 | * |

From FIG. 7, it is to be understood that the crystallization temperature changes depending upon the Si content and the B content and that the Si content and the B content have optimum ranges. Then, these added elements have effects for improving a TMR ratio and are suitable for use with the TMR element applied to the MRAM.

Next, with respect to the samples 10 to 41, TMR ratios (magnetoresistive changing rates) of manufactured TEGs (after annealed at 270° C. for 4 hours) were measured. Further, after the thus manufactured TEGs have been further annealed at 350° C. for 10 hours, TMR ratios (magnetoresistive changing rates) thereof were measured and rates in which TMR ratios were deteriorated (rates in which TMR ratios were decreased after annealing at 350°) were measured by calculation.

Figure 8:
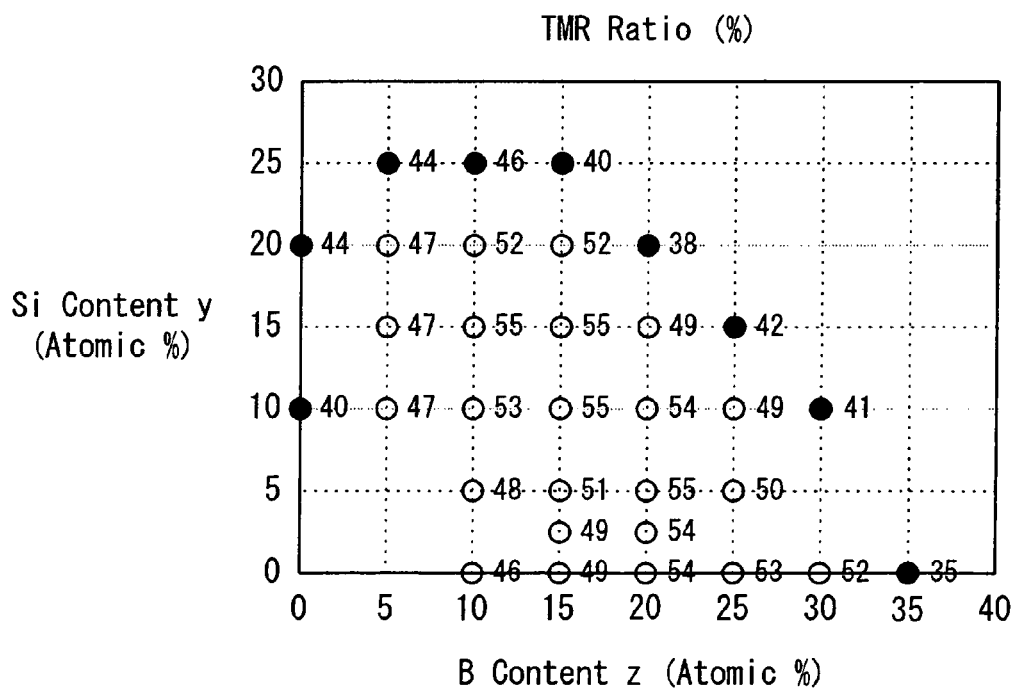
FIG. 8 is a diagram showing a relationship among Si content, B content and a TMR ratio.
Figure 9:
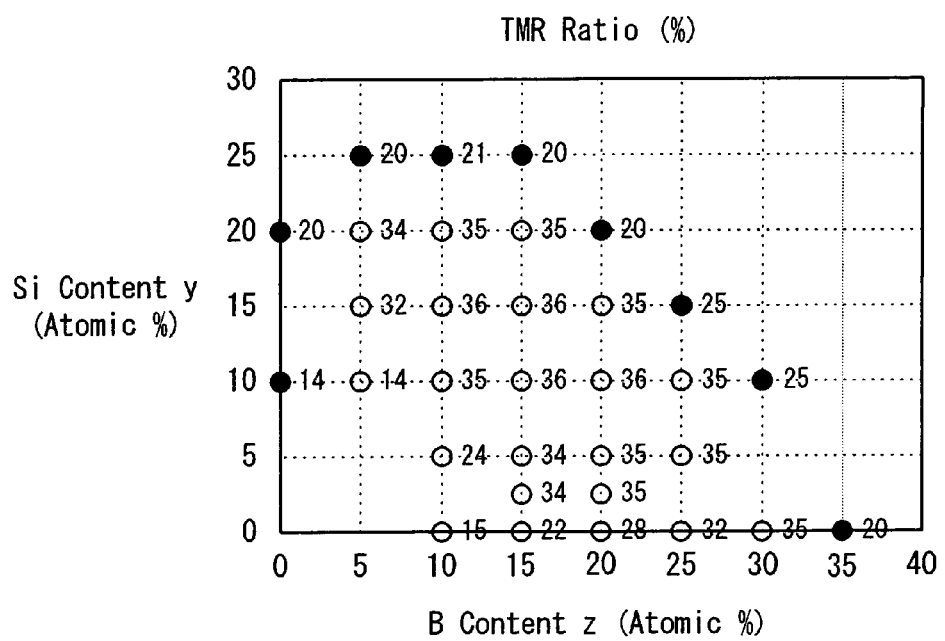
FIG. 9 is a diagram showing a relationship among Si content, B content and a TMR ratio (obtained after annealing at 350° C.)

These measured results are shown on the table 3. Relationships among the Si content y (atomic %), the B content z (atomic %) and TMR ratios are shown in FIGS. 8 and 9. FIG. 8 shows TMR ratios obtained from the manufactured TEGs after they have been annealed at 270° C. for 4 hours, and FIG. 9 shows TMR ratios obtained from the manufactured TEGs after they have been annealed at 350° C. for 10 hours. In FIGS. 8 and 9, open and solid circles denote the same samples shown in FIG. 7.

TABLE 3

| Sample Nos. | Si content (atomic %) | B content (atomic %) | TMR ratio (%) obtained after annealing at 270° C. for 4 hours | TMR ratio (%) obtained after annealing at 350° C. for 10 hours | Deterioration rate of TMR ratio (%) |
|---|---|---|---|---|---|
| 10 | 0 | 10 | 48 | 15 | 67.4 |
| 11 | 0 | 15 | 49 | 24 | 51 |
| 12 | 0 | 20 | 54 | 29 | 46.3 |
| 13 | 0 | 25 | 53 | 32 | 39.6 |
| 14 | 0 | 30 | 52 | 35 | 32.7 |
| 15 | 0 | 35 | 35 | 20 | 42.9 |
| 16 | 2.5 | 15 | 49 | 34 | 30.6 |
| 17 | 2.5 | 20 | 54 | 35 | 35.2 |
| 18 | 5 | 10 | 48 | 25 | 47.9 |
| 19 | 5 | 15 | 51 | 34 | 33.3 |
| 20 | 5 | 20 | 55 | 35 | 36.4 |
| 21 | 5 | 25 | 50 | 35 | 30 |
| 22 | 10 | 0 | 45 | 15 | 66.7 |
| 23 | 10 | 5 | 47 | 22 | 53.2 |
| 24 | 10 | 10 | 53 | 35 | 34 |
| 25 | 10 | 15 | 55 | 36 | 34.5 |
| 26 | 10 | 20 | 54 | 36 | 33.3 |
| 27 | 10 | 25 | 49 | 35 | 28.6 |
| 28 | 10 | 30 | 41 | 25 | 39 |
| 29 | 15 | 5 | 47 | 32 | 31.9 |
| 30 | 15 | 10 | 55 | 36 | 34.5 |
| 31 | 15 | 15 | 55 | 36 | 34.5 |
| 32 | 15 | 20 | 49 | 35 | 28.6 |
| 33 | 15 | 25 | 42 | 25 | 40.5 |
| 34 | 20 | 0 | 44 | 20 | 54.5 |
| 35 | 20 | 5 | 47 | 34 | 27.7 |
| 36 | 20 | 10 | 52 | 35 | 32.7 |
| 37 | 20 | 15 | 52 | 35 | 32.7 |
| 38 | 20 | 20 | 38 | 20 | 47.4 |
| 39 | 25 | 5 | 44 | 20 | 54.5 |
| 40 | 25 | 10 | 46 | 21 | 54.3 |
| 41 | 25 | 15 | 40 | 20 | 50 |

From the results on the table 3 and FIG. 8, it is understood that TMR ratios can be improved by adding Si and B to the Co—Fe alloy. In addition, when a ferromagnetic material having an amorphous structure is used to make a magnetic element (shown by open circles), effects for increasing TMR ratios can be achieved considerably.

On the other hand, since any of the arrangements which are difficult to obtain amorphous structures (respective samples of sample Nos. 15, 22, 28, 33, 38, 39, 40, 41: solid circles) cannot obtain sufficient TMR ratios, these samples are not suitable for the arrangements of the TMR elements.

Further, from the results of the table 3 and FIG. 9, it is to be understood that the TMR ratios of the arrangements that are difficult to have amorphous substance structures (respective samples of sample Nos. 15, 22, 28, 33, 38, 39, 40, 41) are lowered considerably after annealing at 350° C. for 10 hours.

Figure 10:
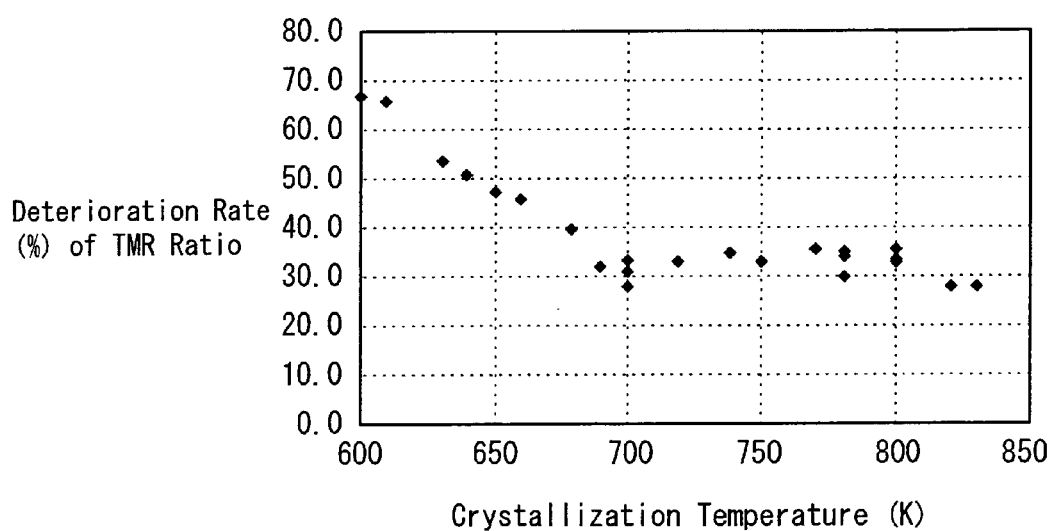
FIG. 10 is a diagram showing a relationship between crystallization temperature and a deterioration rate of a TMR ratio.

In addition, it is also to be understood that the TMR ratios of the arrangements (samples 10 and 23) whose crystallization temperatures are lower than 350° C., i.e., 623 K are considerably lowered after annealing at 350° C. for 10 hours FIG. 10 shows a relationship between crystallization temperatures and deteriorations rates of TMR ratios due to annealing at 350° C.

Figure 11:
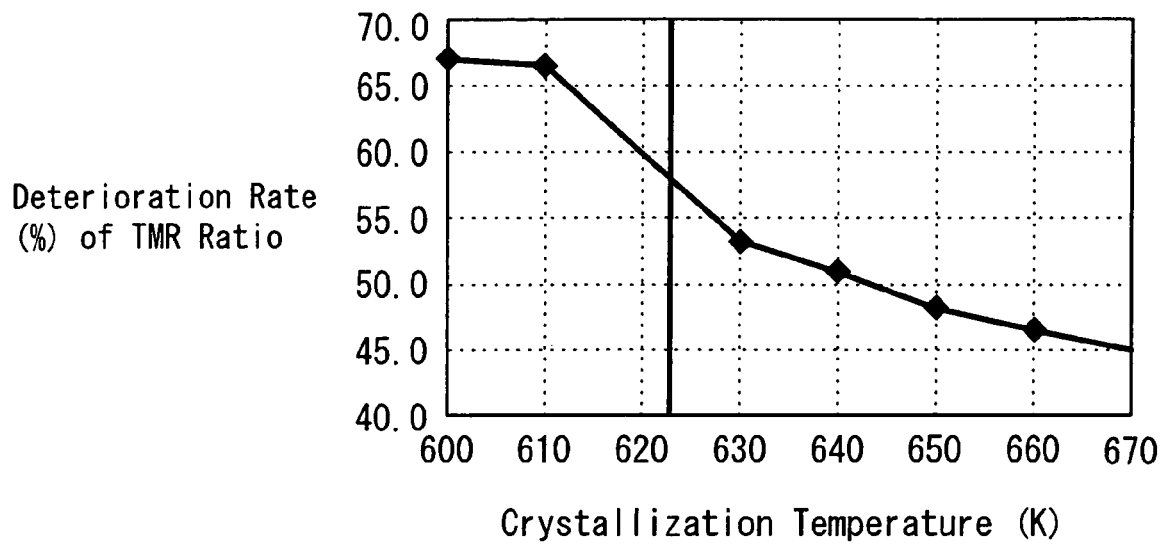
FIG. 11 is a diagram showing optimum composition range of Si content and B content.

A study of FIG. 10 reveals that the deterioration rate of the TMR ratio decreases as the crystallization temperature rises. As FIG. 11, which is a diagram showing a part of FIG. 10 in an enlarged-scale, shows, when the crystallization temperature is higher than 623 K (350° C.), the deterioration rate of the TMR ratio decreases under 60%, and effects achieved by high crystallization temperatures become remarkable.

Figure 12:
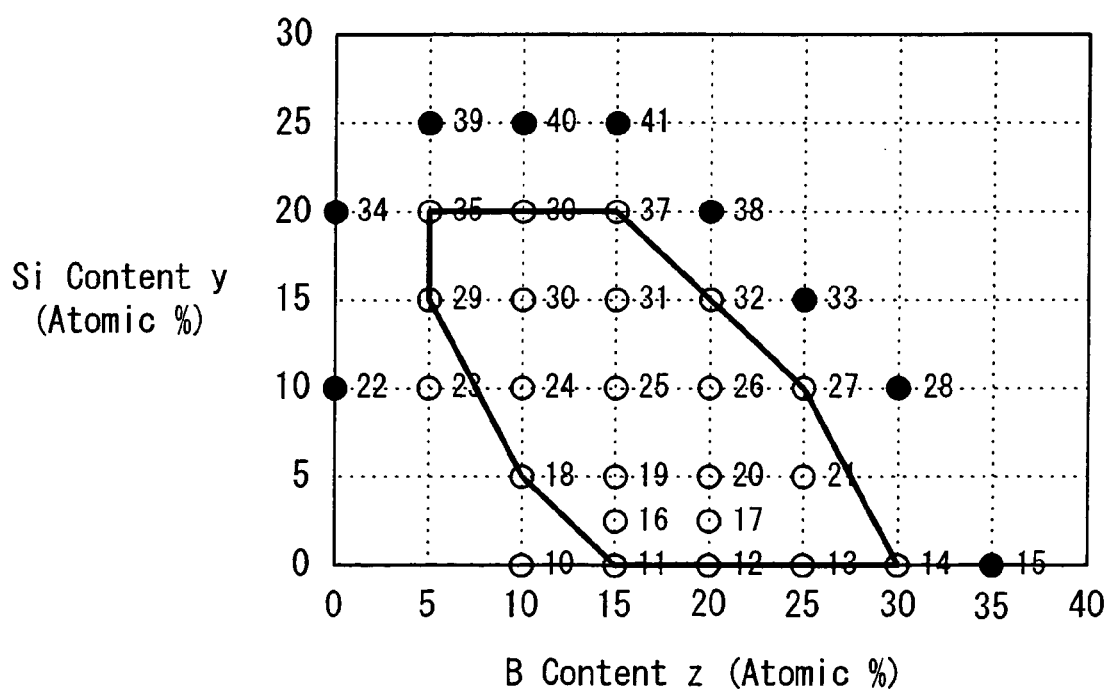

Accordingly, the composition range containing material compositions of the arrangements whose crystallization temperatures are higher than 350° C., i.e., 623 K (samples 11 to 14, 16 to 21, 23 to 27, 29 to 32, 35 to 37) is suitable. This range is illustrated as an area encircled by a bold line in FIG. 12 as a range of the Si content y (atomic %) and the B content z (atomic %). Open circles and solid circles are the same as those of FIG. 7 and numerals attached to open circles and solid circles indicate sample Nos.

(Co and Fe Composition Dependence of TMR Element Using CoFe—Si—B Amorphous Ferromagnetic Material)

Each of samples (samples 42 to 48) of the experiment 3 is of the bottom-spin type, and has a synthetic ferrimagnet structure, only the magnetization free layer being made of amorphous ferromagnetic material. Then, the Si content was fixed to 10 atomic %, the B content was fixed to 20 atomic %, and the composition ratio of Co and Fe was changed.

Crystallization temperatures of these respective samples were measured, and measured results of Co composition ratios, Fe composition ratios in CoFe of respective samples and measured results of crystallization tempertures were shown on the table 4.

TABLE 4

| Sample Nos. | Co/(Co + Fe) (%) | Fe/(Co + Fe) (%) | Crystallization temperature (K) |
|---|---|---|---|
| 42 | 100 | 0 | 810 |
| 43 | 95 | 5 | 800 |
| 44 | 90 | 10 | 800 |
| 45 | 75 | 25 | 800 |
| 46 | 60 | 40 | 810 |
| 47 | 50 | 50 | 800 |
| 48 | 30 | 70 | 800 |

From the table 4, it is to be understood that the crystallization temperatures are not changed substantially even when the composition ratios of Co and Fe were changed.

Next, with respect to these samples 42 to 48, TMR ratios (magnetoresistive changing rates) of manufactured TEGs (that have been annealed at 270° C. for 10 hours) were measured, and TMR ratios (magnetoresistive changing rates) obtained from manufactured TEGs after they have been further annealed at 350° C. for 10 hours also were measured. Deterioration rates of TMR ratios were also obtained by calculation.

These measured results were shown on the table 5.

TABLE 5

| Sample Nos. | Co/(Co + Fe) (%) | Fe/(Co + Fe) (%) | TMR ratio (%) obtained after annealing at 270° C. for 4 hours | TMR ratio (%) obtained after annealing at 350° C. for 10 hours | Deterioration rate (%) of TMR ratio |
|---|---|---|---|---|---|
| 42 | 100 | 0 | 40 | 28 | 30 |
| 43 | 95 | 5 | 49 | 34 | 30.6 |
| 44 | 90 | 10 | 54 | 36 | 33.3 |
| 45 | 75 | 25 | 58 | 38 | 34.5 |
| 46 | 60 | 40 | 56 | 36 | 35.7 |
| 47 | 50 | 50 | 50 | 35 | 30 |
| 48 | 30 | 70 | 42 | 28 | 33.3 |

From the table 5, it is to be understood that the crystallization temperatures of these samples 42 to 48 are higher than 800 K, TMR ratios thereof are lowered lesser after they have been annealed at 350° C. for 10 hours and that their TMR ratios are lowered lesser than those obtained when the crystallization temperature of the previously-described sample 10 is lower than 623 K.

However, the TMR ratios of the samples 42 and 48 are under 45% at the stage in which they are annealed at 270° C. for 4 hours. In other words, the TMR ratios of these samples are too small, and hence these samples are not suitable for use as the magnetic memory device such as the MRAM.

Accordingly, it becomes clear that, in the ferromagnetic material made of Co, Fe, Si, B, more preferable abundances of Co and Fe are $50 \leq Co/(Co+Fe) \leq 95$ and $5 \leq Fe/(Co+Fe) \leq 50$ relative to the total content of Co+Fe.

(Co, Fe and Ni Composition Dependences of TMR Element Using CoFeNi—Si—B Amorphous Ferromagnetic Material)

Any one of respective samples (samples 49 to 60) of the experiment 4 is of the bottom-spin type and has the lamination layer structure, only the magnetization free layer thereof being made of an amorphous ferromagnetic material. Then, changes of characteristics were checked when the composition ratio of Fe and composition ratio of Ni were changed while the Si content was fixed to 10 atomic % and the B content was fixed to 20 atomic %.

Crystallization temperatures of respective samples were measured, and the Co content, the Fe content, the Ni content in the respective samples (Co, Fe, Ni) and measured results of crystallization temperatures are shown on the table 6.

TABLE 6

| Sample Nos. | Co content (%) | Fe content (%) | Ni content (%) | Crystallization temperature (K) |
|---|---|---|---|---|
| 49 | 54 | 6 | 40 | 820 |
| 50 | 45 | 15 | 40 | 820 |
| 51 | 58.5 | 6.5 | 35 | 820 |
| 52 | 48.75 | 16.25 | 35 | 820 |
| 53 | 63 | 7 | 30 | 810 |
| 54 | 52.5 | 17.5 | 30 | 820 |
| 55 | 72 | 8 | 20 | 810 |
| 56 | 60 | 20 | 20 | 810 |
| 57 | 81 | 9 | 10 | 810 |
| 58 | 67.5 | 22.5 | 10 | 810 |
| 59 | 90 | 10 | 0 | 800 |
| 60 | 75 | 25 | 0 | 800 |

From the table 6, it is to be understood that these samples 49 to 60 do not depend upon the composition ratio of Ni too much and that their crystallization temperatures are all higher than 800 K.

With respect to the samples 49 to 60, TMR ratios (magnetoresistive changing rates) of manufactured TEGs (annealed at 270° C. for 4 hours) were measured, and TMR ratios (magnetoresistive changing rate) were also measured after these samples have been further annealed at 350° C. for 10 hours. In addition, deterioration rates of TMR ratios also were obtained by calculation.

These results were shown on the table 7.

TABLE 7

| Sample Nos. | Co content (%) | Fe content (%) | Ni content (%) | TMR ratio (%) obtained after annealing at 270° C. for 4 hours | TMR ratio (%) obtained after annealing at 350° C. for 10 hours | Deterioration rate (%) of TMR ratio |
|---|---|---|---|---|---|---|
| 49 | 54 | 6 | 40 | 38 | 25 | 34.2 |
| 50 | 45 | 15 | 40 | 40 | 26 | 35 |
| 51 | 58.5 | 6.5 | 35 | 45 | 30 | 33.3 |
| 52 | 48.75 | 16.25 | 35 | 46 | 30 | 34.8 |
| 53 | 63 | 7 | 30 | 46 | 30 | 34.8 |
| 54 | 52.5 | 17.5 | 30 | 48 | 32 | 33.3 |
| 55 | 72 | 8 | 20 | 47 | 31 | 34 |
| 56 | 60 | 20 | 20 | 50 | 33 | 34 |
| 57 | 81 | 9 | 10 | 52 | 34 | 34.6 |
| 58 | 67.5 | 22.5 | 10 | 54 | 36 | 33.3 |
| 59 | 90 | 10 | 0 | 54 | 36 | 33.3 |
| 60 | 75 | 25 | 0 | 58 | 38 | 34.5 |

From the table 7, it is clear that the crystallization temperatures of these samples 49 to 60 are higher than 800 K, deterioration rates of TMR ratios obtained after samples have been annealed at 350° C. for 10 hours were small, deterioration rates of TMR ratios of these samples being smaller than those obtained when the crystallization temperature of the previously-described sample 10 or the like is lower than 623 K.

However, the TMR ratios of the samples 49 and 50 are lower than 45% at the stage in which they are annealed at 270° C. for 4 hours. In other words, their TMR ratios are too small, and hence these samples are not suitable for use with the magnetic memory device such as the MRAM.

Accordingly, it is to be understood that in the ferromagnetic material made of Co, Fe, Ni, Si, B, more preferable Ni abundance falls within a range of $0 \leq Ni/(Co+Fe+Ni) \leq 35$ relative to the total content of Co+Fe+Ni.

Added Element Dependence Obtained When Si,B and Other Elements are Added to the Base Alloy Any one of respective samples (samples 61 to 66) of the experiment 5 is of the bottom-spin type and has the synthetic ferrimagnet structure, only the magnetization free layer being made of the amorphous ferromagnetic material. Then, characteristics were measured when chemical elements selected from Si, B, P, C, Al, Mo, Mn, Zr are added to a ferromagnetic alloy of which fundamental composition is CoFe comprising the magnetization free layer.

Crystallization temperatures of respective samples were measured, and compositions of respective samples and measured results of crystallization temperatures are shown on the table 8.

TABLE 8

| Sample Nos. | Composition of material of magnetization free layer | Crystallization temperature (K) |
|---|---|---|
| 61 | $Co_{70.3}Fe_{4.7}P_{13}C_7$ | 740 |
| 62 | $Co_{72}Fe_3P_{16}B_6A_{13}$ | 750 |
| 63 | $Co_{69.6}Fe_{4.6}Mo_{1.8}Si_8B_{16}$ | 790 |
| 64 | $Co_{74.3}Fe_{2.6}Mn_{3.1}Si_4B_{16}$ | 580 |
| 65 | $Co_{63}Fe_7Mn_6B_{24}$ | 740 |
| 66 | $Co_{73}Fe_{8.5}Mo_{9.5}Zr_{9.0}$ | 840 |

From the table 8, it is to be noted that, while the sample 64 has low crystallization temperature under 623 K, other samples exhibit high crystallization temperatures.

Next, with respect to the samples 61 to 66, TMR ratios (magnetoresistive changing rates) of manufactured TEGs (after annealed at 270° C. for 4 hours) were measured, and TMR ratios (magnetoresistive changing rates) of manufactured TEGs obtained after they have been further annealed at 350° C. for 10 hours were also measured. In addition, the deterioration rates of the TMR ratios also were obtained by calculation.

These measured results are shown on the table 9.

TABLE 9

| Sample Nos. | TMR ratio (%) obtained after annealing at 270° C. for 4 hours | TMR ratio (%) obtained after annealing at 350° C. for 10 hours | Deterioration rate (%) of TMR ratio |
|---|---|---|---|
| 61 | 51 | 31 | 39.2 |
| 62 | 46 | 30 | 34.8 |
| 63 | 50 | 34 | 32 |
| 64 | 47 | 21 | 55.3 |
| 65 | 49 | 34 | 30.6 |
| 66 | 53 | 35 | 34 |

From the table 9, it is to be understood that deteriorations of TMR ratios of the samples 63, 65, 66 are small after they have been annealed at 400° C. for 0.5 hour. On the other hand, since the sample 64 has low crystallization temperature under 623 K similarly to the previously-described sample 10, the deterioration of the TMR ratio thereof is large after it has been annealed at 350° C.

As described above, it is to be understood that similar effects are achieved even when C, P, Al, Mo, Zr that are additives for promoting the amorphous substance state to raise crystallization temperatures are added to the ferromagnetic alloy in addition to Si and B.

As shown by the sample 65, other chemical elements such as Mn may be contained in the present invention so long as resultant crystallization temperatures are higher than 623 K.

It is needless to say that similar effects can be achieved when not only Si, B and C, O, Al, Mo, Zr and Mn enumerated in the inventive examples but also semimetal elements known as metalloid elements, e.g. Ge, Ti, Nb, Ta are added to the ferromagnetic alloy. In addition, so long as one kind or more than two kinds are main components of additives added to (Co, Fe, Ni) ferromagnetic alloys, if crystallization temperatures are higher than 623 K and satisfactory TMR ratios are obtained, such metalloid elements also may be included in the scope of the present invention. Then, a TMR element with a satisfactory heat-resisting property and which is best suitable for use as the MRAM can be constructed.

A magnetoresistive effect element (TMR element) according to the present invention can be applied not only to the aforementioned magnetic memory device but also to a magnetic head and a hard disk drive, a magnetic sensor having this magnetic head mounted thereon and an integrated circuit chip and further to various kinds of electronic equipment such as personal computers, personal digital assistants and mobile phones and electronic devices and the like.

The present invention is not limited to the above-mentioned embodiments and can take various arrangements without departing from the gist of the present invention.

According to the above-mentioned magnetoresistive effect element of the present invention, since more than any one layer of the ferromagnetic layers are made of the amorphous ferromagnetic material with the crystallization temperature higher than 623 K, the magnetoresistive changing rate can be improved by the amorphous ferromagnetic material, and a magnetoresistive effect element with an excellent heat-resisting property can be obtained.

As a result, affinity between a magnetoresistive effect element and a semiconductor circuit manufacturing process can be improved. Thus, when the magnetoresistive effect element is applied to a magnetic memory device, read errors can be decreased, and excellent read characteristics can be obtained.

Furthermore, according to the magnetic memory device of the present invention, it is possible to realize a magnetic memory device capable of solving a problem of a heat-resisting property and outputting a large output signal and which has excellent read characteristics.

The invention claimed is:

1. A magnetic memory device comprising:
a magnetoresistive effect element having a pair of ferromagnetic layers opposed to each other through an intermediate layer to cause an electric current to flow in a direction perpendicular to the intermediate layer surface to obtain a magnetoresistive change; and
a word line and a bit line sandwiching said magnetoresistive effect element in the thickness direction,
wherein one of said pair of ferromagnetic layers contains an amorphous ferromagnetic material whose crystallization temperature is higher than 623° K and, except for impurities, whose composition is represented by the formula $Fe_aCo_bNi_cB_dSi_e$, where:
$5 \leq a \leq 45$ atomic percent,
$35 \leq b \leq 85$ atomic percent,
$0 \leq c \leq 35$ atomic percent,
$10 \leq d \leq 30$ atomic percent,
$0 \leq e \leq 20$ atomic percent, and
$a+b+c+d+e+=100$ atomic percent.

2. A magnetic memory device according to claim 1, wherein said magnetoresistive effect element is a spin-valve type magnetoresistive effect element in which one of said pair of ferromagnetic layers is a magnetization fixed layer and the other is a magnetization free layer.

3. A magnetic memory device according to claim 1, wherein said magnetoresistive effect element is a tunnel magnetoresistive effect element using a tunnel barrier layer made of an insulating material or a semiconductor material as said intermediate layer.

4. A magnetic memory device according to claim 1, wherein said magnetoresistive effect element includes a synthetic ferrimagnet structure.

5. A magnetic memory device according to claim 1, wherein said amorphous ferromagnetic material is a ferromagnetic material mainly composed of any one of or more than two kinds of Fe, Co, Ni, said ferromagnetic material containing more than one kind of B, Si, C, P, Al, Ge, Ti, Nb, Ta, Zr, Mo as additive elements.

* * * * *